United States Patent [19]
Kuhara et al.

[11] Patent Number: 5,764,826
[45] Date of Patent: Jun. 9, 1998

[54] PD/LD MODULE AND PD MODULE

[75] Inventors: Yoshiki Kuhara; Naoyuki Yamabayashi; Yasuhiro Iguchi; Yasushi Fujimura; Hiroo Kanamori, all of Osaka, Japan

[73] Assignee: Sumitomo Electric Industries, Ltd., Osaka, Japan

[21] Appl. No.: 687,924

[22] Filed: Jul. 29, 1996

[30] Foreign Application Priority Data

Jul. 26, 1995 [JP] Japan ............................ 7-211166
Dec. 16, 1995 [JP] Japan ............................ 7-347705

[51] Int. Cl.$^6$ ............................................. G02B 6/28
[52] U.S. Cl. ........................ 385/24; 385/88; 385/93; 385/89; 250/227.11; 359/299; 361/728; 257/433
[58] Field of Search ........................ 385/24, 88–94; 250/239, 227.11; 359/299; 315/158; 361/728; 257/433

[56] References Cited

U.S. PATENT DOCUMENTS 5,065,226 11/1991 Kluitmans et al. ............ 385/92 X
5,586,208 12/1996 Nishiyama ........................ 385/93

OTHER PUBLICATIONS

Kawabata et al, "Capacity Enlargement in a Low-Speed PON System by Using Multi-Rate Burst Transmission", 6th International Workshop on Optical Access Networks Oct. 16–19, 1994 Kyoto, Japan, Conference Proceedings, pp. 2.4-1–2.4-5.

Yumoto et al, "Low Cost SingleMode WDM Module", 1990 Spring National Convention Record, The Institute of Electronics, Information and Communication Engineers, p. 4-258 no month.

Adachi et al, "Small and Thin Type Optical Wavelength Division Multiplexing Module", 1990 Autumn National Convention Record, The Institute of Electronics, Information and Communication Engineers, p. 4-264 (1990) no month.

Terui et al, "Optical Module for Fiber Optic Subscriber Systems", NTT R&D, vol. 42, No. 7, 1993, pp. 903–912 no month.

Kawachi, "Current Status and Future Trends in Planar Lightwave Circuit Technologies", NTT R&D, vol. 43, No. 11, 1994, pp. 1273–1280 no month.

*Primary Examiner*—Phan T. H. Palmer
*Attorney, Agent, or Firm*—Cushman Darby & Cushman Intellectual Property Group of Pillsbury Madison & Sutro, LLP

[57] ABSTRACT

Bidirectional optical communication system transmits optical signals with two different wavelengths $\lambda_1$ and $\lambda_2$ ($\lambda_1 < \lambda_2$) between a broadcasting station and a plurality of ONU terminals. Bisecting separation of $\lambda_1$ and $\lambda_2$ requires expensive WDMs. $\lambda_1$-selective photodiode which absorbs all the $\lambda_1$ light and allows all the $\lambda_2$ to pass through is proposed. The energy gap $Eg_1$ of the light receiving layer is determined to be smaller than $hc/\lambda_2$ and larger than $hc/\lambda_1$. The $\lambda_1$-selective photodiode and the other photodiode are positioned in series on a beam line, which dispenses with WDMs.

54 Claims, 22 Drawing Sheets

Bidirectional ONU system

Mirror type WDM, coupler

Quartz planar waveguide type PD/LD module

A − B section

Fiber type PD/LD module

WAVELENGTH DEPENDENCE OF SENSITIVITY 1.3μm selective PD chip

Transparency of a 1.3μm - selective absorption layer

Wavelength dependence of sensitity of 1.3 μm selective-photodiode

Fiber coupler type PD/LD module

Mirror coupler type PD/LD module

Mirror coupler type PD/LD module

Quartz planar waveguide coupler type PD/LD mopdule

Quartz planar waveguide coupler type PD/LD module 1.3μm/1.55μm P D module

Half-mirror wavelength selective coupler type PD/LD module

Wavelength selective coupler
1.55μm transparent/1.3μm half-reflection 1.3μm-selective PD Wavelength selective waveguide coupler-type PD/LD module Waveguide type wavelength-selective couplers Symmetric coupling type Asymmetric coupling type Mach-Zender coupling type Wavelength dependence of selectivity of Symmetric directional coupler Wavelength dependence of selectivity of Asymmetric directional coupler Two-fiber, no-coupler type ONU system ONU module using a wavelength selective PD Dual-line optical fiber system

PD/LD MODULE AND PD MODULE

FIELD OF THE INVENTION

This invention relates to a PD/LD(photodiode/laser diode) module and a PD (photodiode) module which have been used in a bidirectional optical communication system which sends two different light signals of two different wavelengths. The PD(photodiode) module can separate two light waves of two different wavelengths which have travelled in an optical fiber and can receive two waves independently. The PD/LD(photodiode/laser diode) module can further send two different wavelength light waves into an optical fiber.

First, the optical bidirectional communication system is explained. The signal losses in optical fibers have been sufficiently reduced, and the semiconductor lasers (abbreviated as LD) and photodiodes (abbreviated as PD) have also been sufficiently enhanced. Various trials have been done for making communication systems using light signals. This is called an optical communication system. In particular, intensive researches have been done on optical communication systems using the light waves of long wavelengths of 1.3 μm and 1.55 μm. For example, some researchers have tried to send signals from telephones or facsimiles by optical signals which travel in optical fibers.

Optical communication systems have various types. Attention is paid to the possibility of constructing a bidirectional communication system which contains both a low-speed digital communication of transmitting bidirectionally digital signals of telephones and facsimiles and a high-speed analog communication (CATV) of transmitting analog TV signals with a single optical fiber. Such a system has an advantage that only a single optical fiber is needed send bidirectional analog and digital signals from a broadcasting station to many network units at the same time.

FIG. 1 is a schematic view of a prior bidirectional optical communication of a single-fiber type. A broadcasting station (1) converts digital electric signals of telephones or facsimiles (11) into optical signals by a laser of a 1.3 μm band wavelength. The station (1) converts analog signals for television sets into optical signals by another laser diode of 1.55 μm band wavelength. Combining the 1.3 μm signals and 1.5 μm signals together by a wavelength division multiplexer (WDM), the broadcasting station (1) sends the combined signals into an optical fiber. A single optical fiber carries the signal to a point near network terminal units (household). At the point, an optical divider (2) divides the combined signals into sixteen fibers ($G_1$).

The individual fiber ($G_1$) conveys the divided signals to a house. The use of the 16-fold optical distributor (2) can decrease the number of the fibers which are connected to the central broadcasting station (1), because a single fiber can send signals to sixteen houses (terminal units). Such a system which transmits signals to houses (terminal units) by light signals is called an optical network system. The terminals which are connected to the broadcasting station (1) by the fibers are called optical network units (ONU)(3).

The optical signals are converted into electric signals at the optical network units (3). A wavelength division multiplexer (4) at the ONU (3) separates the combined light signals into 1.3 μm digital signals and 1.55 μm analog signals. The 1.55 μm signals are introduced into a photodiode (5) which can exactly regenerate electric signals from 1.55 μm optical signals. The transduced analog electric signals are processed in signal processing circuits and are introduced into television sets (7).

The 1.3 μm signals are converted into digital electric signals by another photodiode (9) for 1.3 μm wavelength. Being processed by a signal processing unit, the digital signals are led into telephones or facsimiles. Then, the information produced at the broadcasting station (1) is regenerated at the terminal units. The flow of the information is called a downward flow. The devices which contribute to the downward flow are named a downward system.

Televisions carry out inherently unidirectional transmission which needs only the downward flow. Telephones and facsimiles, being based essentially upon the bidirectional transmission, require another function for sending signals from the terminal units to the broadcasting station. At a terminal unit, the signals of telephones or facsimiles are processed by signal processing circuits (10) and are converted to optical signals of a 1.3 μm wavelength by a laser diode (LD) (12). The optical signals are transmitted from the ONU terminal (3) in the optical fiber ($G_1/F_1$) to the broadcasting station (1). Then, a 1.3 μm photodiode transduces the 1.3 μm light signals into electric signals at the broadcasting station (1). The flow of information from terminals (3) to the broadcasting station (1) is named an upward flow. The device for the upward flow is called an upward system.

FIG. 2 shows another bidirectional optical communication system of two fiber type. One fiber ($F_1/G_1$) transmits downward signals. The other fiber ($F_2/G_2$) sends upward signals. The broadcasting station (1) makes analog optical signals by a 1.5 μm LD for the CATV and digital optical signals by a 1.3 μm LD for telephones and facsimiles. A WDM combines two kinds of signals into the fiber ($F_1$). An optical distributor (2) divides the signals into 16 fibers ($G_1$) for 16 terminals. The terminal (ONU) (3) produces 1.3 μm digital signals from telephone or facsimile by a 1.3 LD (12). 16 upward fibers ($G_2$) from 16 terminals are gathered by a divider (2') into a single upward fiber ($F_2$). The upward signals are changed into electrical signals by a 1.3 PD in the station (1).

For example, M. Kawabata et al. suggested a bidirectional optical network using a single fiber for bidirectionally sending different wavelength signals and separating different wavelength waves by wavelength division multiplexers. (1) Mitsuru Kawabata, Shuji Suzuki; "Capacity enlargement in a low-speed PON system by using multi-rate burst transmission", 6-th international Workshop on Optical Access Networks October 16–19, 1994 Kyoto, Japan, conference Proceedings, p2.4-1~2.4-5(1994).

In conclusion, a conventional ONU terminal requires a wavelength division multiplexer for separating 1.3 μm light and 1.5 μm light from 1.3 μm & 1.55 μm light signals, two photodiodes PD (5) and PD (9) for O/E conversion and a laser diode LD (12) for E/O change. A set of these terminal devices is called an "ONU module". The present invention proposes an improvement of ONU modules.

BACKGROUND OF THE INVENTION

This application claims the priority of Japanese Patent Applications No.211166/1995 filed Jul. 26, 1995 and No.347705/1995 filed Dec. 15, 1995, which are incorporated herein by reference.

An ONU module has a wavelength division multiplexer for combining or separating light signals of two different wavelengths and a coupler for coupling or dividing light signals of the same wavelength. Several devices have been suggested for candidates of wavelength division multiplexers or couplers. These still remain candidates for ONU modules, however, none has been realized yet. Every candidate has some advantages but suffers from drawbacks which cancel the advantages. [Candidate 1 of an ONU module: mirror-type wavelength division multiplexer+ mirror-type optical coupler]

FIG. 3 shows an example of an ONU module which is based upon a mirror-type wavelength division multiplexer and a mirror-type optical coupler. This ONU module employs dielectric mirrors which have been produced by evaporating dielectric multilayers on glass blocks as a wavelength division multiplexer and an optical coupler. The dielectric mirror is produced by depositing alternately a plurality of thin layers of two kinds of dielectric materials with different refractive indices on slanting surfaces of a triangle glass block and gluing a slanting surface of another triangle glass block on the top of the dielectric multilayers. The glass block has four surfaces which meet at 45 degrees with the dielectric multi-films. An effective path length of a film is determined by a product of a refractive index, a thickness of the film and an inverse of cosine of the slanting angle. The incident light meets with the multi-films at 45 degrees. The light beams are reflected or refracted at all the boundaries of neighboring dielectric films. If light has a wavelength which enables multireflected beams to reinforce with each other, the light of the wavelength is strongly reflected at the dielectric boundary. If light has another wavelength which forces multireflected beams to cancel each other, the light of the wavelength is entirely able to pass the dielectric films. The mirror-type wavelength division multiplexer (4) is produced by a combination of two kinds of dielectic films which allows 1.3 µm light to pass through the dielectric boundary but allows 1.55 µm light to be reflected at the boundary. Thus, the dielectric mirror can separate 1.3 µm light and 1.55 µm light. The 1.3 µm light goes straight through the mirror divider (4) and attains a mirror-type coupler (8).

Like the wavelength division multiplexer (4), the mirror-type coupler (8) has a structure consisting of two triangle glass blocks and dielectric multilayers deposited on a slanting plane of the glass blocks. The dielectric films meet with the front surface of the glass block at 45 degrees. The coupler is different from the wavelength division multiplexer at the selection of a combination of two kinds of dielectric films. The thicknesses and the materials of the dielectric films are selected for allowing a half of 1.3 µm wavelength light to pass through the coupler and another half of 1.3 µm light to be reflected at the dielectric films.

The broadcasting station sends combined optical signals including analog 1.55 µm light and digital 1.3 µm light into optical fibers. The fiber is uniformly connected to 16 fibers at the distributor (not shown in FIG. 2). One of the optical fibers is connected to an optical connector (13) of the ONU module. The light beams propagate in a free space hereafter. Since the path lengthy from the connector (13) to a digital signal photodiode (9) and to a digital signal laser diode (12), a collimator lens (14) is installed in the path for transforming the dispersing beams into a parallel beams. The parallel beams propagate in a free space to the mirror-type wavelength division multiplexer (4) which divides the combined light into 1.3 µm signals and 1.55 µm signals. The coupler (8) unifies a downward fiber communicating to the 1.3 µm photodiode (9) and an upward fiber communicating with the 1.3 µm laser diode (12). Collimator lenses (17) and (18) are provided in the paths leading to the photodiodes (9) and a connector (20) which guides the light signal to another photodiode of analog signals. A collimator lens (19) is installed in the path originating from the laser diode (12).

Such an example of an ONU module has been suggested by (2) Mitsuru Yumoto, Tatsuro Kunikane, Tatsuhiro Ohkawara & Takashi Yokota, "Low cost singlemode WDM module", 1990 Spring National Convention Record, The Institute of Electronics, Information and Communication Engineers C-203, p4-258 (1990) (3) Akihiro Adachi, Kuniaki Motoshima, Yasuo Nakajima, Jun-Ichirou Yamashita & Kumio Kasahara, "Small and thin type optical wavelength division multiplexing module", 1990 Autumn National Convention Record, The Institute of Electronics, Information and Communication Engineers C-222, p4-264 (1990)

This type of a modules, however, have a drawback of a difficulty in making a good mirror-type wavelength division multiplexer for separating 1.3 µm light from 1.55 µm light with a high extinction ratio. In FIG. 3 or FIG. 1, fiber (a) is a path for 1.55 µm light and fiber (b) is another path for 1.3 µm light. 1.3 µm light must be fully excluded from the path (a) for 1.55 µm light. Similarly, the path (b) must entirely exclude 1.55 µm light. If the extinction ratios are poor, the noise from the counterpart paths impairs the receiving performance of televisions (1.55 µm) or telephones(1.3 µm). Each path of (a) and (b) must have a good extinction ratio of less than $10^{-4}$. If the extinction ratio is larger than $10^{-4}$, the noise impairs the quality of picture or sound of the TV or the telephone. Conventional mirror-type wavelength division multiplexers cannot obtain desired extinction ratios yet. To compensate the inefficiency of the extinction ratios, a multilayered filter (15) may be inserted in the path (a) for perfectly excluding 1.3 µm light and a multilayered filter (16) shall be inserted in the path (b) for killing 1.55 µm light. Then this type requires a wavelength division multiplexer, an optical coupler and dielectric filters. [Candidate 2 of an ONU module: waveguide-type wavelength division multiplexer+waveguide-type optical coupler]

FIG. 4(a) shows a structure of a waveguide-type module. The module produces a wavelength division multiplexer and a coupler by quartz-type planar waveguides. The waveguide-type module is promising, because the module has advantages of reducing the number of parts and minimizing the size of a module. The planar lightwave circuit (named a "PLC") is produced by depositing a cladding layer (23) on a silicon substrate (22), doping an impurity (e.g.,Ge) for raising the refractive index into the cladding layer (23) in lines. A waveguide line (24) starts from a front end and bisects into two waveguide lines (25) and (26) at point (f). The waveguide lines (24), (25) and (26) form an optical coupler (8) of a waveguide type. The lines (25) and (26) bend midway and form parallel lines (27) and (28). Furthermore at point (g), another waveguide line (29) is originated from the vicinity of the line (24). The line (29) leads to a line (30) and line (31). A final end of a single mode fiber (32) joins to the front end of the waveguide line (24). A set of the waveguide lines (24) and (29) in the vicinity of point (g) acts as a wavelength division multiplexer for separating 1.3 µm light and 1.55 µm light. An example of FIG. 4 was proposed by (4) Hiroshi Terui, Satoshi Sekine, Morio Kobayashi & Mitsuru Naganuma, "Optical Module for Fiber Optic Subscriber Systems", NTT R&D vol.42, No.7, 1993, p903–912.

In FIG. 4(a), the downward signals from a broadcasting station propagate in the single-mode fiber (32). The light signals contain 1.3 µm wavelength light and 1.55 µm wavelength light signals. The light enters the optical waveguide (24) at the front end. The wavelength division multiplexer (4) separates the combined waves into 1.3 µm light and 1.55 µm light. Going straight in the path (b), 1.3 µm light attains the optical coupler (8) which equally communicates with the waveguide lines (25) and (26). The lines (25) and (27) are downward paths. The lines (26) and (28) are upward paths.

The downward waves spreading in the line (25) pass the dielectric multilayer filter (34) and reach a photodiode (PD) (9) for detecting digital 1.3 μm signals. This is the mode of reception of the downward the digital signal light.

Sending signals are produced by a laser diode (LD) (12) which is modulated by digital electrical signals from a telephone or a facsimile. The light beams emanating from the laser diode (12) are converged by a lens (33) to a narrow core of the waveguide (28) at the end. The light propagates in the waveguide lines (28), (26) and (24). Then, the 1.3 μm light conveying digital signals enters the optical fiber (32) and progresses in the fiber to the broadcasting station.

1.55 μm light transfers to the bisecting line (30) at the point (g) and enters the analog output fiber (36) which communicates with another photodiode. In addition, multilayered dielectric filters (34) and (35) are interposed in the downward paths (b) and (a) for annihilating unnecessary 1.55 μm light and 1.3 μm light respectively.

The waveguide-type module can be built with a wavelength division multiplexer or an optical coupler which have been made on a quartz substrate by making waveguide lines touch (e.g. at (g)) or bisect (e.g. at (f)) with each other. Such a waveguide-type module has been suggested, for example, by (5) Masao Kawachi, "Current Status and Future Trends in Planar Lightwave Circuit Technologies", NTT R&D vol.43, No.11, (1994) p1273–1280.

The module dispenses with a lens between the waveguide line (27) and the photodiode (9), because the photodiode (9) is so close to the end of the line (27) that light beams from the line (27) do not disperse at the photodiode (9). Similarly, there is no lens between the line (31) and the fiber (36), since the fiber (36) is directly glued to the waveguide (23) at the end of the line (31). There is no need to install a lens between the laser diode (LD) (12) for digital signals and the line (28). This example, however, installs a lens (33) between the LD (12) and the line (28) for introducing the sending light into the line (28) with a high efficiency.

The advantage of the waveguide type module is making the module on a single substrate, which enables the module to minimize the whole size. Curtailment of the number of parts is another advantage of the module. Furthermore, the planar waveguide is congenial to optical fibers, since waveguides have the similarity in core diameters and materials to optical fibers. [Candidate 3 of an ONU module: fiber-type wavelength division multiplexer and fiber-type coupler]

This module makes use of a fiber-type wavelength division multiplexer which has been already brought into practice. It is called a fiber-type WVDM. Similarly, a coupler using optical fibers is also in practical use. This is named a fiber coupler. Moreover, a fiber-type filter having dielectric multilayers and two fibers sandwiching the dielectric multilayers has been produced. An ONU module can be fabricated by assembling the fiber-type parts. FIG. 5 exhibits an example of a fiber-type ONU module.

An input single-mode fiber (39) is connected via the distributor to the broadcasting station. The fiber (39) is joined through an optical connector (40), to the ONU terminal. A fiber-type WDM (43) is constructed by disposing two fibers (41) and (42) parallel in a certain length at a short distance. The short distance enables two fibers to exchange their energy through the tails of wave functions extending in cladding layers. The function of exchanging energy between two neighboring fibers is called an evanescent coupling. The length and the distance determine what wavelength can exchange their power and what wavelength cannot exchange their power between the neighboring fibers. This example transfers 1.55 μm light to the bisecting fiber (42) by the evanescent coupling but forces 1.3 μm light to remain in the current fiber (41). Spreading in the path (b), the 1.3 μm light wave passes an optical connector (44) followed by a fiber (45). The fiber (45) is bisected into a fiber (46) and another fiber (47). This bisection forms an optical fiber coupler (48). The fiber coupler (48) enables two fibers to exchange their energy either by arranging two fibers parallel at close positions or by twisting two fibers with each other for shortening the distance between the cores.

The optical fiber (46) leads to a multilayered filter (59). The signals propagate from the filter (59) through an optical connector (49) into a fiber (50) and enter a digital photodiode module PD (51) which converts the light signals into electric ones for telephones or facsimiles.

Digital electric signals from telephones or facsimiles are transduced into optical signals by a digital laser diode LD module (53). The light signals propagate from the LD module (53) in an optical fiber (54) to an optical connector (52). Going through a fiber (47) of the fiber coupler (48), the upward signals further pass the fiber-type wavelength division multiplexer (43) and propagate in the fiber (39) to the broadcasting station.

1.55 μm input light signals are separated from the 1.3 μm light by the wavelength division multiplexer (43) into a bisecting fiber (42). Going through a dielectric multilayer filter (55) and a connector (56), the 1.55 μm light propagates in a fiber (57) and attains an analog photodiode (PD) module (58) which transduces the light signals into analog electric signals.

This example makes the coupler and the wavelength division multiplexer only with optical fibers. Optical fibers can be bent freely in various modes. Excellent elasticity of fibers enables a maker to dispose analog circuit devices and digital circuit devices at electrically convenient positions. The optical parts can easily be combined each other by splicing the fibers together. The possibility of splicing gives a maker a high freedom of designing of the parts of the module.

PROBLEMS TO BE SOLVED

The most important part in the system of FIG. 1 or FIG. 2 is the wavelength division multiplexers (WDM). Examples of a mirror-type ONU module, waveguide type ONU module and fiber-type ONU module have been explained by FIG. 3, FIG. 4 and FIG. 5. All the examples require a wavelength division multiplexer (WDM) for dividing or combining 1.3 μm light and 1.55 μm light and a coupler for unifying a downward fiber and a upward fiber. The example depicted in FIG. 2 dispenses with a coupler, owing the use of two fibers, but still requires a wavelength division multiplexer.

A WDM is an expensive part due to the difficulty of producing a WDM with a high extinction ratio. A fiber-type WDM is produced by melting parts of two fibers, pulling the molten parts, and gluing two fibers on sides for forming an evanescent coupling which enables two wavelengths to exchange energy. As mentioned before, other types of WDM other than the fiber-type have been proposed. In any case, a WDM requires a low loss of light power and a high extinction ratio (full isolation of two wavelengths). These requirements raise the cost of producing good WDMs. WDMs are still expensive devices.

There are other drawbacks for adopting WDMs in an ONU module. The existence of a WDM hinders the module from reducing the size. The WDM increases the number of steps of assembling the parts into an ONU module. In particular, the WDM would impose a high expenditure on ONU users, if an ONU module employed an expensive WDM.

By these reasons, prior ONU modules are all complex and expensive by the existence of WDMs and couplers. If WDMs can be omitted, inexpensive ONU modules will be made.

The Inventors sought the reason why the ONU modules are so complex and bulky and considered how to simplify the structure of modules. The inventors have an insight to the reason of making ONU modules complex and bulky. Any proposals of ONU modules are plagued with a prejudice of geometric separation of 1.3 μm light and 1.55 μm light before detecting the light power by photodiodes. The preparatory, geometric bisection of light of different wavelengths increases the complexity of modules. The WDM should be eliminated from a module for simplifying the structure and for decreasing the size. The WDM can be removed, if 1.3 μm light need not be separated from 1.55 μm light for some reason. Omission of a WDM will enable makers to build a simplified module.

Then, why must 1.3 μm light and 1.55 μm light be preoperatively separated in prior ones? What has forced the module to bisect two wavelengths geometrically before the photodetectors? The Inventors have sought the true reason of requiring WDMs in conventional ONU modules.

The structure of photodetectors matters to the preliminary bisection. To our surprise, what complicates the ONU module is the photodetectors. The fact may be difficult to understand. First, the structure of prior photodiodes is now explained for clarifying the problem.

FIG. 6 shows a section of an example of conventional photodiode chips. An n-type InP buffer layer (61), an n-type InGaAs light receiving (light absorption) layer (62) and an n-type InP window layer (63) are epitaxially deposited on an n-type InP substrate in succession by an epitaxial growth method. InGaAs is a mixture crystal which rigorously is expressed by $In_xGa_{1-x}As$ with a parameter x. However, the condition for lattice fitting with InP determined uniquely the mixture ratio x. In this case, x is a definite value. Thus, $In_xGa_{1-x}As$ is simply described as InGaAs hereafter.

The outer periphery of the n-InP window layer (63) is coated with an insulating passivation film (66). Zinc, p-type dopant, is diffused at the center of the InP window layer (63) and half of the InGaAs receiving layer (62). Dish-shaped dotted part (64) is a p-region diffused with zinc atoms. Outer parts are n-type semiconductor. A pn-junction is formed between the p-region and the n-region. The pn-junction lies at a middle height of the InGaAs layer (62).

A p-side electrode (65) is formed on the periphery of the Zn-diffused p-region (64). The p-electrode (65) is an annular electrode. Light enters a central part (69) encircled by the annular electrode (65). An antireflection layer (67) is deposited on the central light-receiving region (69). On the rear side, an n-side electrode (68) is formed on the bottom surface of the n-type InP substrate (60). Since no light enters the photodiode from the n-side electrode (68), the whole bottom surface of the substrate (60) is covered with the electrode metal.

In operation, the p-electrode (65) is biased negative and the n-electrode (68) is biased positive. When incident light, an assembly of photons, enters the InGaAs receiving layer (62), a photon generates a pair of an electron and a hole. The electron flows toward the n-electrode (68) and the hole flows toward the p-electrode (65) by the action of the bias voltage. The flow of electrons and holes is called a photocurrent. The reason why the InGaAs is adopted as a light absorption layer is a high sensitivity of InGaAs to infrared light.

FIG. 7 exhibits a graph of sensitivity of the photodiode as a function of the wavelength of incident light. The abscissa is the wavelength (μm) of the light. The ordinate is the sensitivity (A/W) of the photodiode. Sensitivity is defined as a quotient of photocurrent divided by light power. The conventional photodiode has high sensitivity in a wide wavelength range from 1.0 μm to 1.6 μm. Namely, this photodiode enjoys high sensitivity both for 1.3 μm light and 1.55 μm light. What determines the range of wavelength of high sensitivity is the material of the light absorption (receiving) layer. In the prior photodiode of FIG. 6, the physical property of InGaAs determines the range of high sensitivity. The upper limit (λb) is determined by the band gap of the light absorption layer.

The lower limit wavelength (λa) of the high sensitivity range is determined by the band gap of the window layer just upon the light absorption layer. In this case, the window layer is InP. The lower limit (λa) is uniquely given by the band gap of InP. The relation between the high sensitivity region and the band gaps of the layers is now clarified.

Light is an assembly of photons. A photon has energy h ν=hc/λ, where h is the Plank constant, ν is the frequency of light and λ is the wavelength of light. The band gap (Eg) characterizes the semiconductor. If the energy (hc/λ) of a photon of the incident light is smaller than the band gap Eg of the semiconductor (λ>hc/Eg), this light passes the semiconductor without being absorbed. Ideally, the semiconductor is fully transparent to the light. Namely, the transparency is 100% for the light.

On the contrary, when the energy (hc/λ) of a photon of the incident light is bigger than the band gap (Eg), the photon is annihilated by making a pair of an electron and a hole. Namely, the light is absorbed by the semiconductor. (hc/Eg) is the wavelength corresponding to the band gap Eg of the semiconductor. The wavelength λg=(hc/Eg) is the critical photon energy of the light which can be or cannot be absorbed by the semiconductor. The band gap Eg is alternatively called an edge of intrinsic absorption. Eg is the energy difference between the top of the valence band and the bottom of the conduction band. Then, λg can be named an absorption edge wavelength. In brief, when the wavelength λ of the incident light is shorter than the absorption edge wavelength λg (λ<λg), the incident light is entirely absorbed. When the wavelength of the incident light is longer than the absorption edge wavelength λg (λ>λg), the incident light can penetrate through the semiconductor without loss. The transition from the full absorption to the perfect transparency depicts a steep curve. The curve, however, is obscured by the action of temperature. When the temperature is 0K(Kelvin: absolute temperature), a full transparent region is clearly differentiated from a full absorption region at the edge λg, since the valence band has no hole and the conduction band has no electron. At a definite temperature, some electrons are exited to the conduction band and some holes are excited to the valence band. Then the transparency graph or the absorption graph blunts in the vicinity of λg. The higher the temperature rises, the blunter the absorption curve becomes.

A photodiode is produced essentially by assembling two kinds of semiconductors for a window layer and for a absorbing layer. Penetrating through the window layer, the incident light attains the absorption (receiving) layer. Thus the band gap ($Eg_1$) of the window layer (63) must be greater than the band gap ($Eg_2$) of the absorption layer (62). Namely, $Eg_1 > Eg_2$. The reason is now explained.

The energy of the incident light is denoted by $Ep=hc/\lambda$. $Ep < Eg_1$ is required for the incident light penetrating through the window layer without loss. However, $Ep > Eg_2$ is demanded for giving sufficient sensitivity to the absorption layer ($Eg_2$), since a semiconductor can absorb only a photon of energy Ep bigger than its band gap Eg. These requirements are satisfied, when an inequality $Eg_1 > Eg_2$ holds. Namely, the material of the window layer must be selected from the materials having a band gap bigger than that of the receiving layer. If InP is the material of the window layer, the receiving (absorbing) layer must be built with a semiconductor which has a narrower band gap than InP. Then, InGaAs has been used for the absorbing layer in prior photodiodes for detecting infrared light.

The selection of the layers enables the conventional photodiodes to detect only the light which can freely penetrate through the window layer ($Eg_1$) and can be fully absorbed in the absorption (receiving) layer ($Eg_2$). Namely, photodiodes detect the light which satisfies an inequality $Eg_1 > Ep > Eg_2$. In other word, if $\lambda g_1 < \lambda < \lambda g_2$, the light ($\lambda$) can be sensed by the photodiode. The lower limit $\lambda a$ of the high sensitivity region (FIG. 7) is equal to the effective wavelength $\lambda g_1$ of the window layer. The upper limit $\lambda b$ of the high sensitivity region is equal to the wavelength $\lambda g_2$ of the absorption layer. Thus, $\lambda a = \lambda g_1$, $\lambda b = \lambda g_2$. InGaAs has an absorption edge wavelength longer than 1.55 µm. InP has an absorption edge wavelength shorter than 1.3 µm. When a photodiode has an InGaAs receiving layer and an InP window layer, the photodiode has significant sensitivity both for 1.3 µm and 1.55 µm, because $\lambda g_1 < 1.3$ µm $< 1.55$ µm $< \lambda g_2$. The absorption edge wavelength $\lambda g_1$ of InP is 0.92 µm. The absorption edge wavelength $\lambda g_2$ of InGaAs is 1.67 µm.

Prior modules of FIG. 1 to FIG. 5 adopt the same photodiodes both to the photodiode for 1.55 µm analog signals and to the photodiode for 1.3 µm digital signals. The analog 1.55 µm PD (5) and the digital 1.3 µm PD (9) in FIG. 1 are essentially the same photodiode whose sensitivity is given by the graph of FIG. 7. Both the PD (5) and the PD (9) similarly sense both 1.3 µm and 1.55 µm. If 1.3 , m light attains the 1.55 µm PD (5) owing to a defect of the WDM (4), the 1.3 µm light induces a photocurrent, which is nothing but noise for the 1.55 µm PD (5). On the contrary, if 1.55 µm light reaches the 1.3 µm PD (9) due to an imperfection of the WDM, the 1.55 µm induces noise in the 1.3 µm PD (9).

The reason why the 1.3 µm light path must be separated from the 1.55 µm light path is the common use of the photodiodes sensible both for 1.3 µm and 1.55 µm as the analog 1.55 µm PD (5) and the digital 1.3 µm PD (9). The necessity of geometric separation of 1.3 µm and 1.55 µm light requires the WDMs. The bisection of 1.3 µm and 1.55 µm light brings about such a complex structure of prior modules.

If the light path need not be bisected by some reasons, the structure can be simplified. A single light path for different wavelengths would realize the simplification of modules. A breakthrough may be given by the single path and the separate detection of different wavelengths. Is it possible to build up the module without bisecting the light path for 1.3 µm and 1.55 µm?

The reason why conventional modules must divide the paths for 1.3 µm and for 1.55 µm is that the photodiodes have no selectivity in the wide range of the wavelength including 1.3 µm and 1.55 µm. The necessity of bisection of the paths originates from the fact that two photodiodes equivalently sense both 1.3 µm light and 1.55 µm light.

SUMMARY OF THE INVENTION

If there were a special photodiode which absorbs only 1.3 µm light but allows 1.55 µm light to pass through without loss, the module which uses such photodiodes could dispense with the spatial separation of the light paths. If such a photodiode can be made, the photodiode itself will be entirely novel. Such a photodiode can be named an "exclusive 1.3 µm photodiode". Further, if such an exclusive photodiode could be produced, we could build a simplified, linearized ONU module which could detect both 1.3 µm light and 1.55 µm light independently without cross-talk by installing the exclusive 1.3 µm photodiode first on a beam line and placing a second photodiode at a rear spot on the same beam line. The exclusive photodiode and the linear arrangement is an essence of this invention.

The photodetecting part of an ONU module of this invention comprises a first photodetector which absorbs all the 1.3 µm light but permits all the 1.55 , m light to pass and a second photodiode which is placed at the back of the first photodiode on the beam line. This invention has two important points. One is a linear arrangement of two photodiodes. Namely, two photodiodes are placed in series on a straight beam line. The other point is the adoption of an exclusive 1.3 µm photodiode which absorbs all the 1.3 µm light but does not absorb 1.55 µm light at all as the first photodiode.

First of all, the first photodiode must be provided with the following requirements;

(1) sensing 1.3 µm light, (2) absorbing all the 1.3 µm light which has entered, (3) having no sensitivity to 1.55 µm light, and (4) allowing all the 1.55 µm light which has entered to pass through without significant loss.

These four requirements are novel conditions themselves. There has never been such a photodiode which satisfies the requirements. The photodiode is entirely novel also for the new properties. A linear assembly of such a novel photodiode and a conventional photodiode is the ONU module that this invention proposes.

The relation between the band gap of semiconductors and the absorption of light has been explained before. Requirement (1) and requirement (2) are originally different conditions. Requirement (3) and requirement (4) are also different with each other. Then, four parameters should be necessary for sufficing the four requirements. Conveniently, a proper determination of one parameter can satisfy both requirements (1) and (2) at the same time and a determination of another parameter can satisfy requirements (3) and (4), since semiconductor has a favorable property between the band gap and the absorption before described. The Inventors of this invention found the special property for the first time.

Above mentioned, all the light whose energy is larger than the band gap is absorbed by the semiconductor. The other light with an energy below the band gap passes the semiconductor. Thus, the absorption edge wavelength $\lambda g_2$ of the receiving layer determines the upper limit wavelength $\lambda b$ of the region of sensitivity. Namely, $\lambda g_2 = \lambda b$. Similarly, the absorption edge wavelength $\lambda g_1$ of the window layer determines the lower limit wavelength $\lambda a$ of the sensitivity region, where $\lambda g_1 = \lambda a$. "1" is a suffix denoting the window layer, and "2" is a suffix of the absorption layer.

Requirement (3) is satisfied by shortening the upper limit wavelength $\lambda b$ to a definite value between 1.3 µm and 1.55

μm. λb is given by the edge λg$_2$ of the material of the absorption layer. Then the absorption layer edge λg$_2$ should satisfy an inequality $$1.3 \text{ μm} < λg_2 < 1.55 \text{ μm}. \quad (1)$$

This inequality (1) plainly expresses the feature of the present invention. The present invention proposes to adopt a semiconductor with an absorption edge lower than 1.55 μm as the material of the absorption layer (light receiving layer). It is possible that the light absorption layer can absorb all the 1.3 μm light (requirement (2)) by designing the thickness of the absorption layer.

Furthermore, requirement (4) is contented by perforating a wide hole at the center of the n-side electrode of the first PD for allowing the 1.55 μm light to pass through out.

The material of the window layer matters for sufficing the requirements. Since 1.3 μm can go through the window layer without loss, the band gap Eg$_1$ of the window layer should be wider than the photon energy of 1.3 μm light (requirement (1)). However, visible light with an energy higher than 1.3 μm light should be forbidden from entering the window layer. Favorably, the band gap of the window layer should be determined at a value which is slightly higher than 1.3 μm energy. The above requirement can be briefly shown by an inequality $$λg_1 < 1.3 \text{ μm}. \quad (2)$$

The optoelectronic module of this invention, therefore, is a device comprising a first PD sensing the 1.3 μm and being transparent to 1.55 μm and a second PD for 1.55 μm connected in series to the first PD. This is an improvement of a PD module (an O/E transducer or an optoelectronic system). This improvement dispenses with WDMs, since the module need not separate the paths for 1.3 μm light and 1.55 μm light.

The biggest advantage of the present invention is the possibility of omission of WDMs. The omission of WDMs curtails the cost of making an ONU module by simplifying the structure and by decreasing the size.

In addition, this invention has other advantages. Since this invention gives wavelength selectivity to photodetectors themselves, no 1.55 μm light mixes into 1.3 μm signals. No 1.3 μm signals mix into 1.55 μm signals. The selectivity of photodiodes enables the ONU modules to reduce cross-talk and receive images and sound of high quality.

This invention can be also generalized for a PD/LD module or a PD module using two different wavelengths λ$_1$ and λ$_2$ (λ$_1$ < λ$_2$). The module aligns a λ$_1$-selective PD and a λ$_2$ PD in series on a beam line. Λw denotes the edge wavelength of the window layer. Λc denotes the edge wavelength of the light receiving layer (absorption layer). The requisite condition is briefly expressed by an inequality of Λw<λ$_1$<Λc<λ$_2$. The same matter is represented as hc/Eg$_1$<λ$_1$<hc/Eg$_2$<λ$_2$, wherein Eg$_1$ is the edge energy of the window layer and Eg$_2$ is the edge energy of the absorption layer. Otherwise, in the energy representation, the same condition becomes Eg$_1$>hc/λ$_1$>Eg$_2$>hc/λ$_2$. Since Eg$_1$>hc/λ$_1$ is a matter of course, the essential requirement is an inequality of hc/λ$_1$>Eg$_2$>hc/λ$_2$ or, equivalently λ$_1$<hc/Eg$_2$<λ$_2$.

DETAILED DESCRIPTION OF PREFERRED EMBODIMENTS

Figure 1:
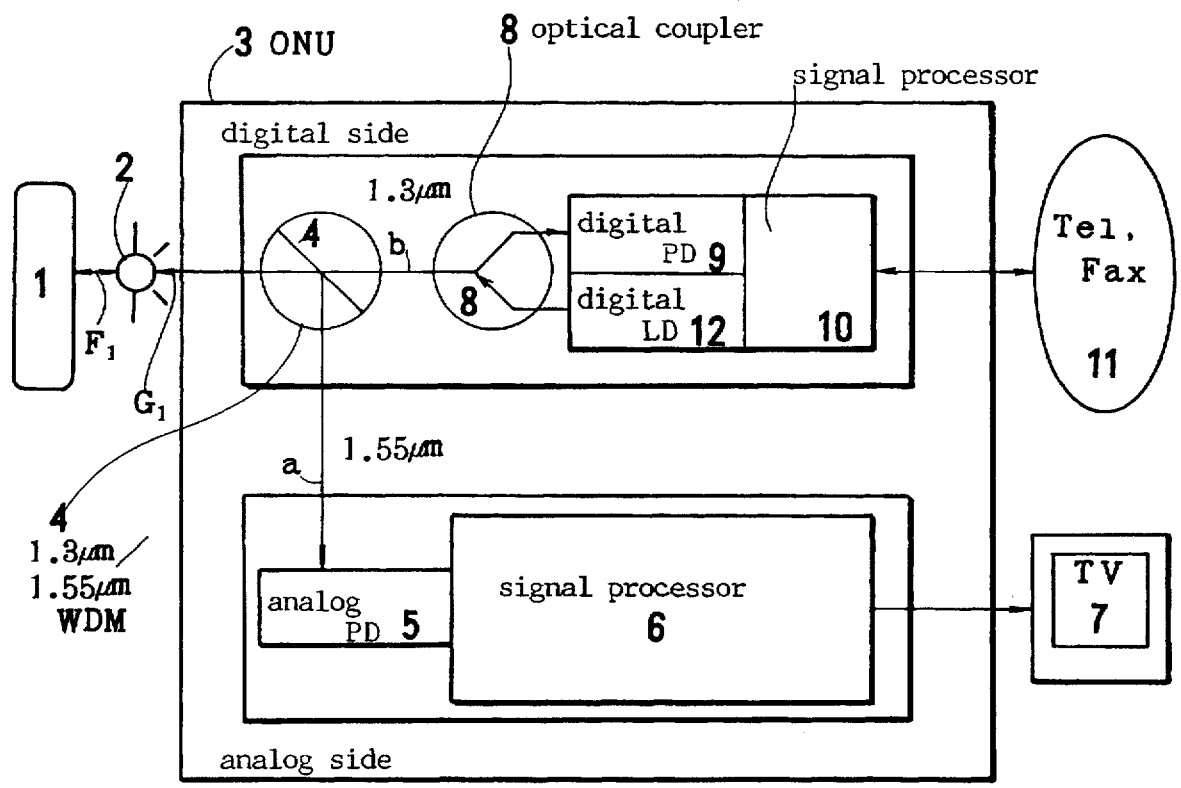
FIG. 1 is a schematic view of a prior bidirectional optical communication system of transmitting bidirectionally optical signals of 1.3 μm and 1.55 μm in a single optical fiber been a broadcasting station and a plurality of ONU terminals.

One of the most important parts is a first photodiode which senses 1.3 μm light by absorbing all the 1.3 μm light but has no sensitivity for 1.55 μm light and allows all the 1.55 μm light to pass through. The structure of the newly-proposed photodiode is explained by referring to FIG. 8. The photodiode has an n-type InP substrate (70). An n-type InP buffer (71), an n-type InGaAsP light receiving (absorption) layer (72) and an n-type InGaAsP window layer (73) are deposited on the n-InP substrate (70) in turn by an epitaxial growing method. Although the mixing ratio x and y are omitted in the expressions of InGaAsP of the window layer and the absorption layer, the mixing ratios are different for the window layer and the absorption layer. The absorption edge wavelength $\lambda g_2$ of the InGaAsP light absorption layer (72) is 1.42 μm in the example. The absorption edge $\lambda g_1$ of the InGaAsP window layer (73) is 1.15 μm.

A p-region (79) is formed at the central part of the InGaAsP window layer (73) and the InGaAsP receiving layer (72) by diffusing zinc(Zn) atoms. A pn-junction is formed between the p-region (79) and the n-window layer and the n-absorption layer. An annular p-side electrode (74) is produced on the surface of the p-type InGaAsP window layer (73). The p-electrode (74) forms an ohmic contact with the undercoating p-InGaAsP window layer (73). A passivation film (75) covers the periphery of the window layer (73) out of the annular p-electrode (74) and protects revealing ends of the pn-junction. An antireflection film (76) is formed on the central part of the p-type InGaAsP window layer enclosed by the annular electrode (74). Passing the antireflection film (76), the incident light waves (80) attain the p-region (79) and the pn-junction.

An annular n-side electrode (77) is deposited on the bottom surface of the n-type InP substrate (70) for forming an ohmic contact with the InP substrate (70). Unlike conventional n-electrodes, this n-side electrode does not cover the whole bottom of the n-InP substrate (70). The n-side electrode is formed annularly on the periphery of the bottom of the n-InP substrate (70). The central opening allows light beams to go out without loss. An antireflection film (78) is formed on the revealed central part of the InP substrate (70).

This newly-proposed photodiode is different from prior photodiodes at the following three points.

(1) The window layer is changed from the conventional InP ($\lambda g=0.92$ μm) to an InGaAsP ($\lambda g_1=1.15$ μm).

(2) The light receiving (absorption) layer is changed from the conventional InGaAs ( $\lambda g=1.67$ μm) to an InGaAsP ($\lambda g_2=1.42$ μm).

(3) There is a wide opening at the bottom n-electrode on the bottom of the InP substrate for allowing light beams to pass through the opening.

Figure 9:
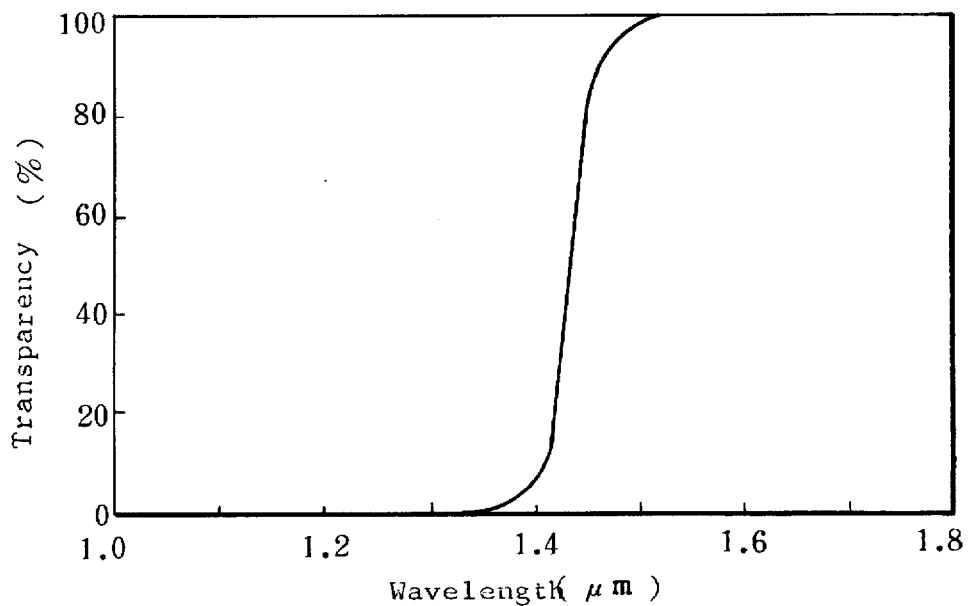
FIG. 9 is a graph of a wavelength-dependence of transparency of the InGaAsP absorption layer of the 1.3 μm selective photodiode of this invention.

FIG. 9 is a graph showing transparency of the absorption layer (72) which is a selectively grown for sensing only 1.3 μm light. The abscissa is the wavelength of light. The ordinate is the relative transparency (%). Since the edge wavelength $\lambda g$ of the absorption layer is 1.42 μm, the photodiode is fully transparent for all the light with a wavelength longer than 1.42 μm. On the contrary, the photodiode absorbs all the light beams whose edge wavelength is shorter than 1.42 μm. Namely, all the light with a wavelength of 1.3 μm is absorbed by the light receiving (absorption) layer (72). But all the light with a wavelength of 1.55 μm passes the absorption layer (72) without loss. However, the receiving layer must be thick enough for absorbing all the 1.3 μm light.

The upper limit of the wavelength range of definite sensitivity to the photodiode is determined by the edge wavelength $\lambda g_2(1.42$ μm) of the absorption layer. The lower limit of the wavelength range of sensitivity is determined by the edge wavelength of $\lambda g_1(1.15$ μm). The newly-proposed photodiode can detect only the light in a narrow range of wavelength between 1.15 μm and 1.42 μm.

Figure 10:
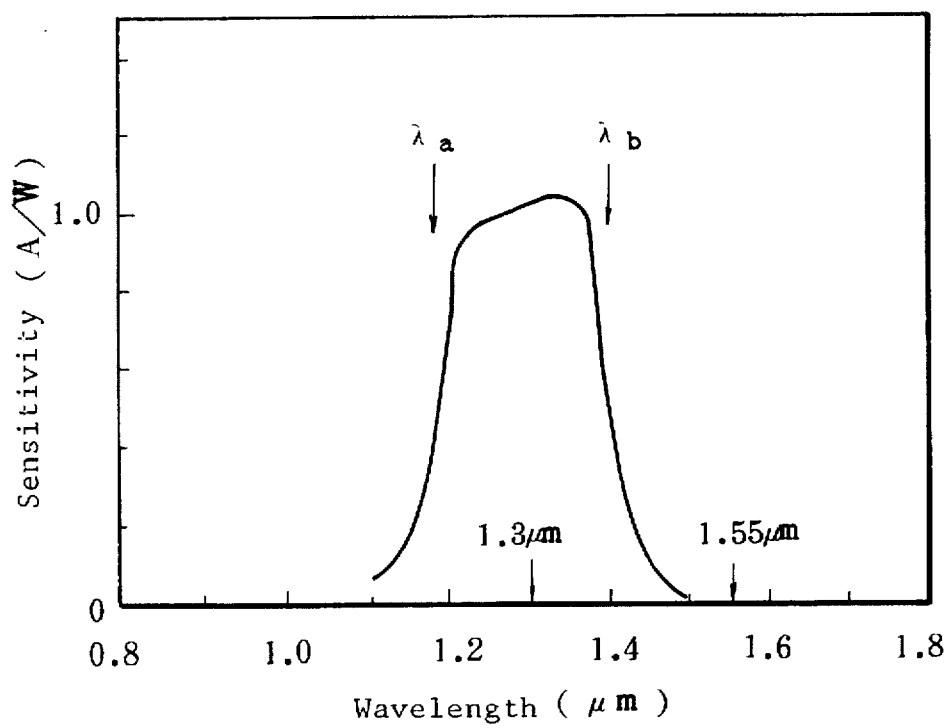
FIG. 10 is a graph showing the wavelength-dependence of the sensitivity of a 1.3 μm selective photodiode of this invention.

FIG. 10 is a graph denoting the sensitivity as a function of wavelength of the photodiode. The sensitivity curve has a quasi-rectangular, narrow peak between 1.15 μm and 1.42 μm. This photodiode can sense nothing but the light between 1.15 μm and 1.42 μm. This photodiode does not sense 1.55 μm light at all. When 1.55 μm light goes through the photodiode, the 1.55 μm light induces no noise, since the photodiode has no sensitivity for 1.55 μm.

FIG. 9 shows the fact that this photodiode allows 1.55 μm light to go through without loss. This property is obtained by lowering the upper limit of the sensitivity region from 1.55 μm. In general, the edge $\lambda g_2$ of the absorption layer must be a value between 1.3 μm and 1.55 μm. This example chooses $\lambda g_2=1.42$ μm which is just a middle value of the region.

Regarding the window layer, $\lambda g_1$, the edge wavelength, should be shorter than 1.3 μm. This example selects $\lambda g=1.15$ μm. Alternatively, InP ($\lambda g=0.92$ μm) is also available for the window layer.

Furthermore, the opening of the n-electrode on the bottom of the n-type InP substrate is indispensable for 1.55 μm light to go out of the photodiode. The light which goes out from the bottom is only 1.55 μm light. The 1.3 μm has been entirely absorbed in the absorption layer.

The photodiode of this invention is now called a "1.3 μm-selective photodiode" or a "1.3 μm photodiode". This means a special PD which is sensitive and fully-absorptive to 1.3 µm but inactive and fully-transparent to 1.55 µm. This invention adopts a four-component mixed crystal InGaAsP instead of a conventional three-component mixed crystal InGaAs, since three-component mixture crystals cannot afford to realize an arbitrary band gap. A four-component mixture crystal can give a desired band gap by selecting the mixing ratios of components. A four-component mixed crystal can be expressed as $In_{1-x}Ga_xAs_{1-y}P_y$ by using two mixing parameters x and y. A four-component mixed crystal has two mixing ratios for determining the components. In a photodiode, the buffer layer, the light absorption layer and the window layer must have the same lattice constant as the InP substrate. The condition of lattice fitting gives a restriction on the mixing ratios x and y. However, there remains still one degree of freedom. Thus, a four-component mixed crystal can give an arbitrary band gap. The relation between the components of mixture crystals and the band gaps has been explained, for example, by (6) Tetsuji Imai "Compound Semiconductor Device (I)", Kabushikigaisya Kogyo Chousakai (1984), p56, p87.

As described before, a band gap Eg can be expressed by a wavelength λg(Eg=hc/λg). Two mixing ratios are uniquely determined by the lattice fitting condition and the desired band gap Eg.

Here, the absorption layer (receiving layer (72) is assumed to have an edge wavelength $\lambda g_2$=1.42 µm. 1.42 µm edge determines x=0.34 and y=0.24. $In_{0.66}Ga_{0.34}As_{0.76}P_{0.24}$ is the full expression of the absorption layer (72) in the example. The light receiving layer (72) is entirely transparent for 1.55 µm. 1.3 µm light, however, is fully absorbed by the receiving layer (72) of x=0.34 and y=0.24.

If the window layer (73) should have the edge $\lambda g_1$=1.15 µm, the mixing ratios are determined to be x=0.18 and y=0.60. The full expression is $In_{0.82}Ga_{0.18}As_{0.40}P_{0.60}$ for the window layer (73). The window layer (73) is transparent both for 1.3 µm light and 1.55 µm light. It is a matter of course. The window layer (73) acts as a window for the light to be detected. The window layer (73), however, absorbs the light with a wavelength shorter than 1.15 µm and forbids the light from attaining the absorption layer.

Figure 8:
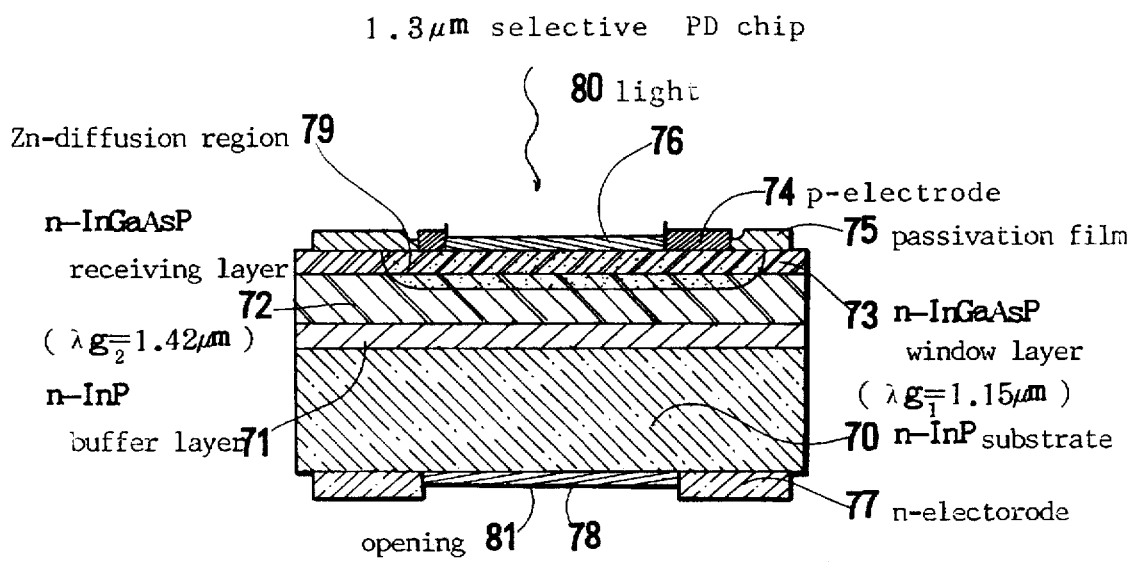
FIG. 8 is a vertically-sectioned view of a 1.3 μm- selective photodiode chip of this invention having sensitivity to 1.3 μm but no sensitivity to 1.55 μm.

The method of producing the photodiode chip of FIG. 8 is explained. An n-type InP wafer of a thickness of 350 µm is prepared as a substrate (70). An n-InP buffer layer (71) of a 2.5 µm thickness, an n-InGaAsP ($\lambda g_2$=1.42 µm) receiving layer (72) of a 4.5 µm thickness, and an n-InGaAsP window layer ($\lambda g_1$=1.15 µm) (73) of a 1.5 µm thickness are grown in turn on the InP substrate (70) by a liquid phase epitaxy. The transparency of the wafer is measured as a function of wavelength. FIG. 9 shows the result of the transparency measurement. The epitaxial wafer absorbs all the light having a wavelength less than 1.42 µm but allows the light with a wavelength longer than 1.42 µm to pass through. The transparency changes drastically at 1.42 µm.

Figure 6:
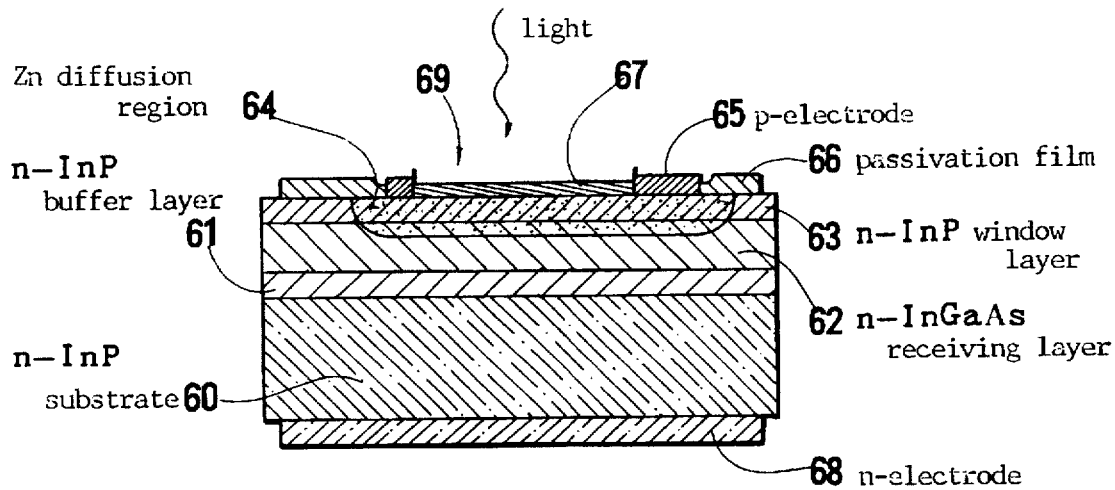
FIG. 6 is a vertically-sectioned view of a conventional InP substrate near-infrared photodiode chip having an InGaAs light receiving layer and an InP window layer.
Figure 7:
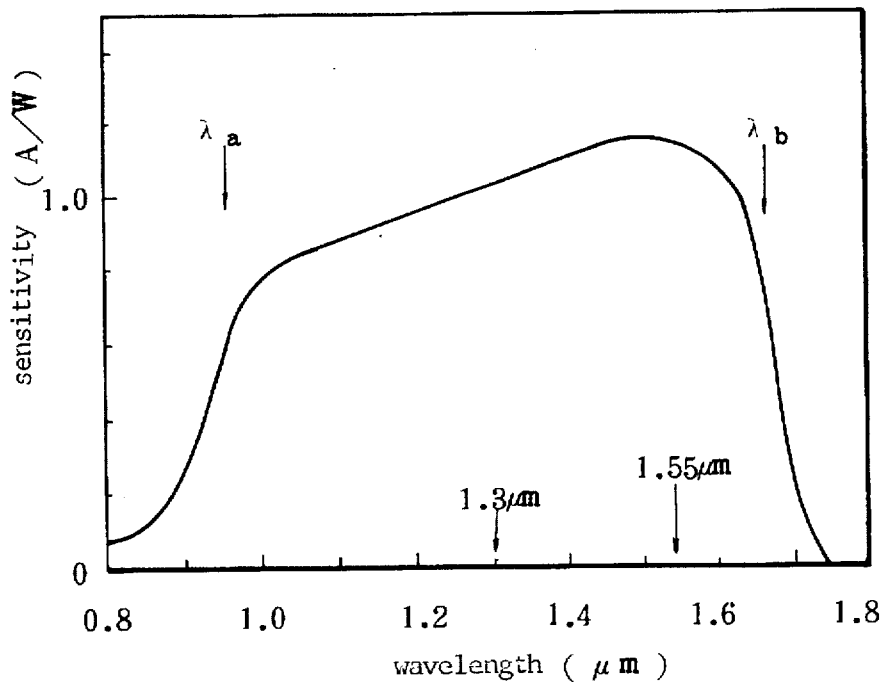
FIG. 7 is a graph showing the wavelength-dependence of the sensitivity of a conventional InP substrate near-infrared photodiode.

The wafer is selectively masked by a photoresist. Zn atoms which are p-type dopants in InP are diffused through the openings of the resist to the epitaxial wafer. These processes are similar to the steps of making the photodiode of FIG. 6. A p-region (79) is produced at the center of the InGaAsP window layer (73) and the InGaAsP receiving layer (72). An annular p-electrode (74) and a passivation film (75) are formed on the window layer (73). An n-electrode (77) is formed on the bottom of the InP substrate (70). A central part of the n-electrode is eliminated for allowing the 1.5 µm light to go out. An antireflection film (e.g., $SiO_2$) for 1.55 µm is formed on the central opening of the n-electrode. Another antireflection film (e.g., $SiO_2/SiN$ multilayer) (76) for both 1.3 µm and 1.55 µm is formed on the top surface of the window layer (73).

A photodiode is made by mounting the chip on a package. Then the sensitivity is measured as a function of wavelength at the condition with a reverse bias of 5 V. FIG. 10 is the result of the measurement. The photodiode reveals a high sensitivity for 1.3 µm light but has no sensitivity to 1.55 µm light. The example makes the epitaxial layers by the liquid epitaxial method. However, the epitaxial layers can be made by a chloride epitaxial method.

[EMBODIMENT 1: 1.3 µm/1.55 µm PD/LD module of a mirror-coupler type; No.1]

Figure 11:
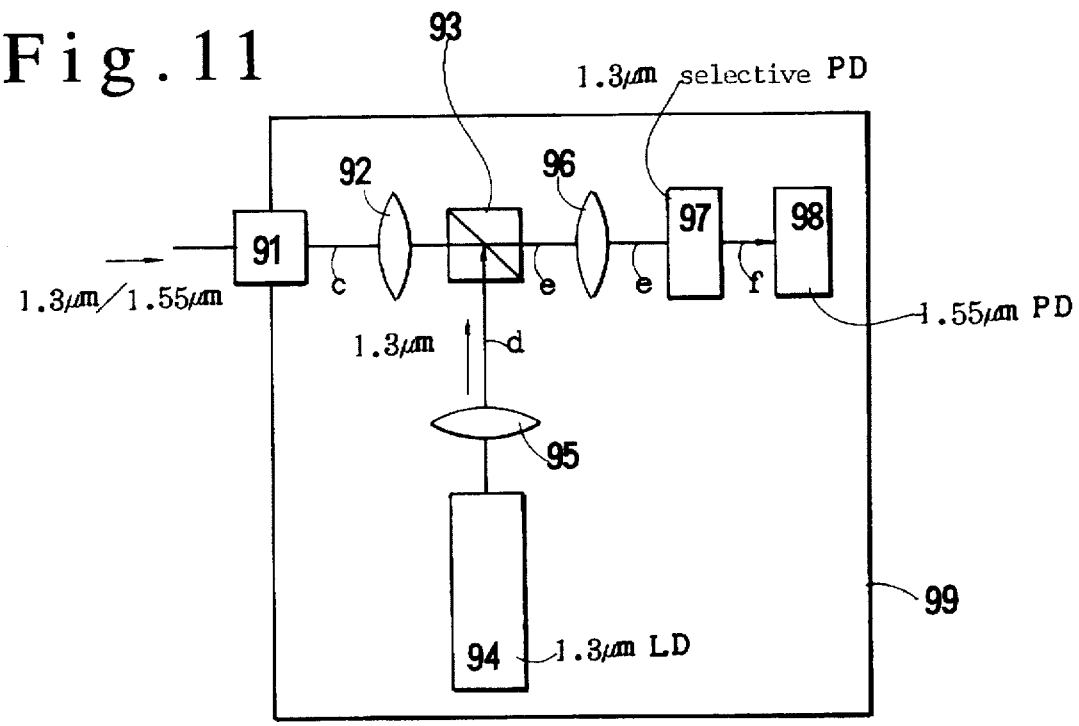
FIG. 11 is a schematic view of a mirror coupler type ONU module with a built-in 1.55 μm PD of a first embodiment.

FIG. 11 shows an embodiment of a 1.3 µm/1.55 µm photodetector module using a mirror-coupler. A broadcasting station (not shown) sends an assembly of 1.3 µm digital signals and 1.55 µm analog signals in an optical fiber. Travelling in the fiber, the light carrying the 1.3 µm/1.55 µm signals enters an ONU terminal (99) through an optical connector (91). The light beams propagate in free space (c) and attain a collimator lens (92) which converts the diverging beams into parallel beams. The parallel beams are divided into two packets of beams by a mirror-type coupler (93). One packet of the beams directly passing the mirror is converged by a lens (96). The beams spread in a space (e) and attain a 1.3 µm-selective photodiode (97). The other packet of the beams is reflected to the direction of a laser diode (94) by the mirror-coupler (93). The beams have no role, since the beams vanish without being detected.

Being converged by a collimator lens (96), the light beams propagate along a spatial path (e). A first photodiode (97) and a second photodiode (98) align on an extension of the path (e). The first photodiode is a 1.3 µm-selective photodiode that this invention proposes. The second PD (98) is one of conventional PDs. The signal light penetrates the first 1.3 µm-selective photodiode (97) of this invention which absorbs all the 1.3 µm light and allows the 1.55 µm light to pass through. The first photodiode (97) detects the 1.3 µm digital signals for telephones or facsimiles. The 1.55 µm light carrying analog signals goes out from the PD (97) and reaches the other photodiode (98) which is one of ordinary PDs with a wide range of sensitivity. The second photodiode (98) detects only the 1.55 µm light, since the light beams at a path (f) contain nothing of 1.3 µm light, although the second PD (98) has enough sensitivity to 1.55 µm.

Embodiment 1 aligns the 1.3 µm-selective photodiode (97) and the photodiode (98) for 1.55 µm in series on a straight line, assigning the first PD (97) to sensing the digital 1.3 µm signals and the second PD (98) to transducing the analog 1.55 µm signals. This invention need not divide a light path any more unlike a conventional module which used to bisect the light path into a path (a) and another path (b) by a wavelength division multiplexer (WDM). This invention dispenses with a WDM. Omission of a WDM enables the ONU module to simplify the structure by reducing the number of light paths. A conventional modules required dielectric multilayers for compensating the shortage of the extinction ratio of the wavelength division multiplexer (WDM). This invention requires no dielectric multilayer, since the light path is not bisected by a WDM. Elimination of dielectric multilayers reduces the cost of parts, which contributes to realize a smaller, more inexpensive ONU module. Embodiment 1 includes an analog PD (98) within the module.

[EMBODIMENT 2: 1.3 µm/1.55 µm PD/LD module of a mirror-coupler type; No.2]

Figure 12:
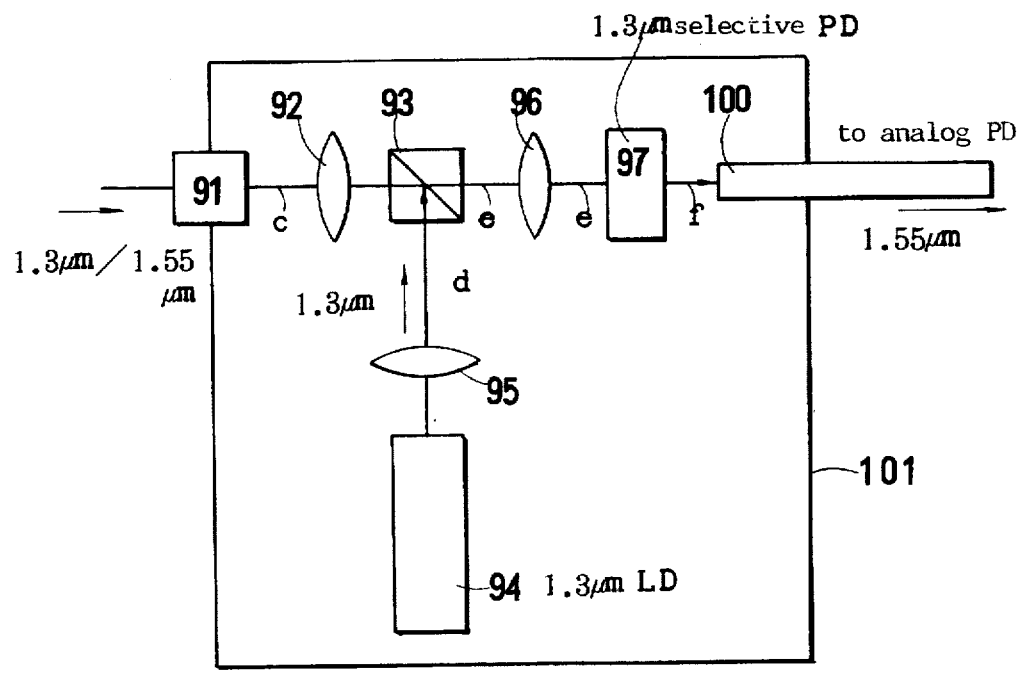
FIG. 12 is a schematic view of a mirror coupler type ONU module of a second embodiment with a fiber leading to an external 1.55 μm PD.

FIG. 12 shows another example of an ONU module using mirror-coupler type. This example has a similar structure to embodiment 1, since two examples commonly adopt a mirror as a coupler. The upward signals from a laser diode (94) are reflected by a mirror-coupler (93) and are led into an optical fiber by an optical connector (91). The downward signals from the fiber pass a mirror coupler (93) and a 1.3 μm-selective photodiode (97). The signals arrive at an optical fiber (100) which communicates with an external 1.55 μm photo diode (not show) stored in some external apparatus, e.g. televisions. Embodiment 2 is different from embodiment 1 at the location of the 1.55 μm photodiode. Embodiment 2 installs the 1.55 μm photodiode in some outer apparatus which uses the O/E converted signals for some purposes. Embodiment 2 is suitable for a system having an object apparatus out of the ONU module (101).

Embodiment 1 and embodiment 2 do without dielectric multilayer, because the 1.3 μm PD (97) absorbs all the 1.3 μm light and the path (f) is fully immune from 1.3 μm light.

But, if some part of the 1.3 μm light leaked out to the path (f), a filter for cutting 1.3 μm light should be allocated at a point in the path (f).

[EMBODIMENT 3: 1.3 μm/1.55 μm PD/LD module of a planar waveguide for a coupler; No.1]

Figure 13:
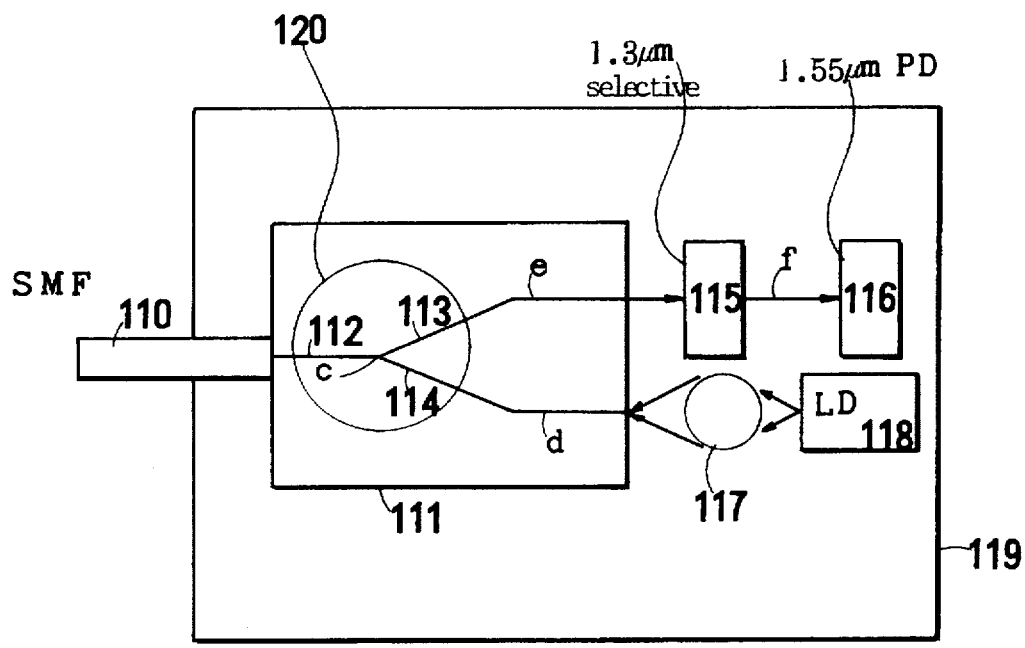
FIG. 13 is a schematic view of a quartz planar waveguide coupler type ONU module with a built-in 1.55 μm PD of a third embodiment.

FIG. 13 shows an example of an ONU module using a planar waveguide as a coupler which divides or combines light waves. The signals from the broadcasting station (not shown) travel in a single-mode optical fiber (110). The end of the fiber (110) is stuck to a front end of a quartz substrate having an optical waveguide (111) on a surface. The waveguide (111) has three paths (112), (113) and (114) which have been made by doping impurity for raising the refractive index. The path (112) bisects into the paths (113) and (114) at point (c). The paths (112), (113) and (114) make an optical coupler (120).

The optical signals transfer from the single-mode fiber SMF(110) to the waveguide path (112). The signals are divided at the bisecting point (c) into the path (113) and the path (114). The light choosing the path (114) dies away without being detected. The light progressing in the path (113) propagates in the path (e) and goes out of the quartz waveguide (111). A 1.3 μm-selective photodiode (115) and another photodiode (116) are aligned in series on an extension of the path (e). The light from the path (e) enters the 1.3 μm-sensitive photodiode (115). The 1.3 μm light is transduced from optical power to a photocurrent by the PD (115). The PD (115) fully absorbs the 1.3 o m. The rest, 1.55 μm light, further travels in a free space path (f) and arrives at the second photodiode (116) which is one of conventional photodiodes. The 1.55 μm light is transduced by the PD (116) from light to a photocurrent. Embodiment 3 is an example which contains both the 1.3 μm PD (115) and the 1.55 μm PD (116) in a package (119).

The upward (transmitting) system is similar to conventional modules. Digital electric signals from telephones or facsimiles are transduced to optical signals by a laser diode (118). The upward light is converged by the lens (117) to an end of the path (d) made on the quartz waveguide (111). The light progresses in the paths (114) and (112) and goes into the SMF (110) which transports the signals to the central broadcasting station.

This ONU module is free from a WDM. The module can be built with small number of parts. Curtailment of parts reduces the cost of production by simplifying the structure. The waveguide coupler enables the module to minimize the size further.

[EMBODIMENT 4: 1.3 μm/1.55 μm PD/LD module of a planar waveguide for a coupler; No.2]

Figure 14:
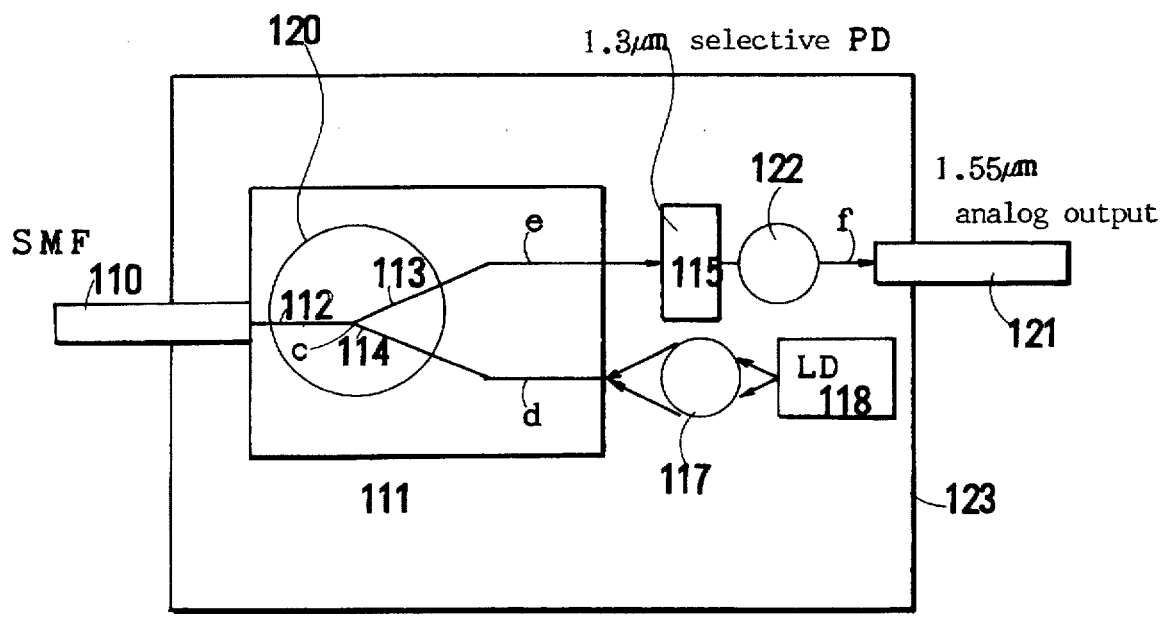
FIG. 14 is a schematic view of a quartz planar waveguide coupler type ONU module of a fourth embodiment with a fiber leading to an external 1.55 μm PD.

FIG. 14 exhibits another example using a waveguide. Unlike embodiment 3, this module has not the 1.55 μm analog PD within the package (123). The second PD is provided in some apparatus, e.g., in a television set. An optical fiber (121) conveys the 1.55 μm light from the lens (122) to the external apparatus. Other structure is similar to embodiment 3 of FIG. 13.

[EMBODIMENT 5: 1.3 μm/1.55 μm PD/LD module of an optical fiber coupler]

Figure 15:
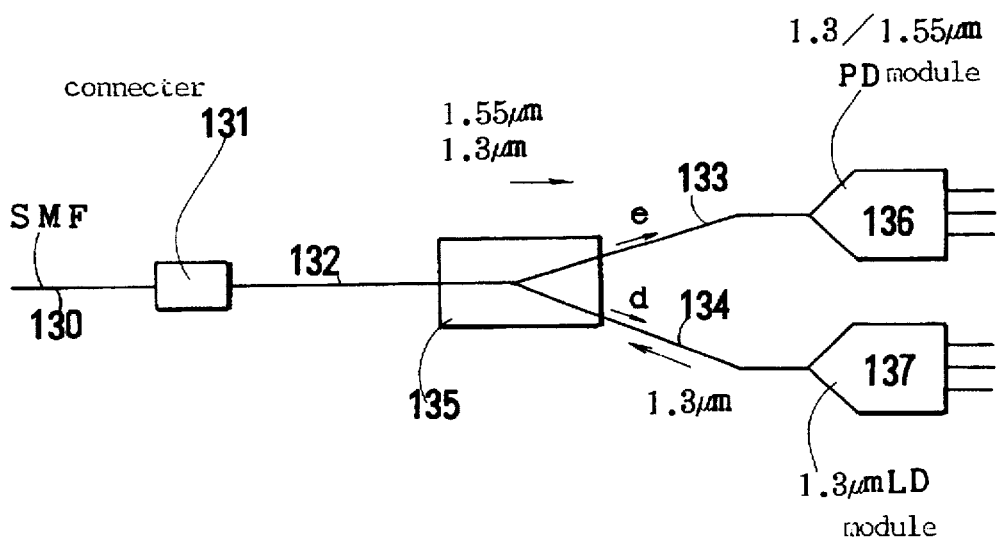
FIG. 15 is a schematic view of an optical fiber coupler type ONU module with a 1.3 μm/1.55 μm PD module of a fifth embodiment.

FIG. 15 shows an embodiment using an optical fiber coupler for dividing and combining 1.3 μm and 1.55 μm light. A single-mode fiber (130) connects a broadcasting station with an ONU terminal via an optical connector (131). The connector (131) joints the fiber (130) to an inner fiber (132) which is bisected into a first fiber (133) and a second fiber (134) at a fiber coupler (135). The fiber (133) leads to a 1.3 μm/1.55 μm PD module (136) which contains a 1.3 μm-selective photodiode and a 1.55 μm photodiode in series. The other fiber (134) joins to a 1.3 μm LD module (137) which converts the electric signals of telephones or facsimiles to optical signals of 1.3 μm. The upward signals from the laser diode propagate in the fibers (134), (132) and (130) to the broadcasting station. This embodiment is built with only optical fibers. This fiber-type PD module has a special advantage over embodiments 1 to 4. The elasticity of the optical fiber gives a vast freedom in designing the relative positions of the parts. The high freedom of location of parts is a conspicuous strong point of the fiber-type module.

[EMBODIMENT 6: 1.3 μm/1.55 μm PD module]

Figure 16:
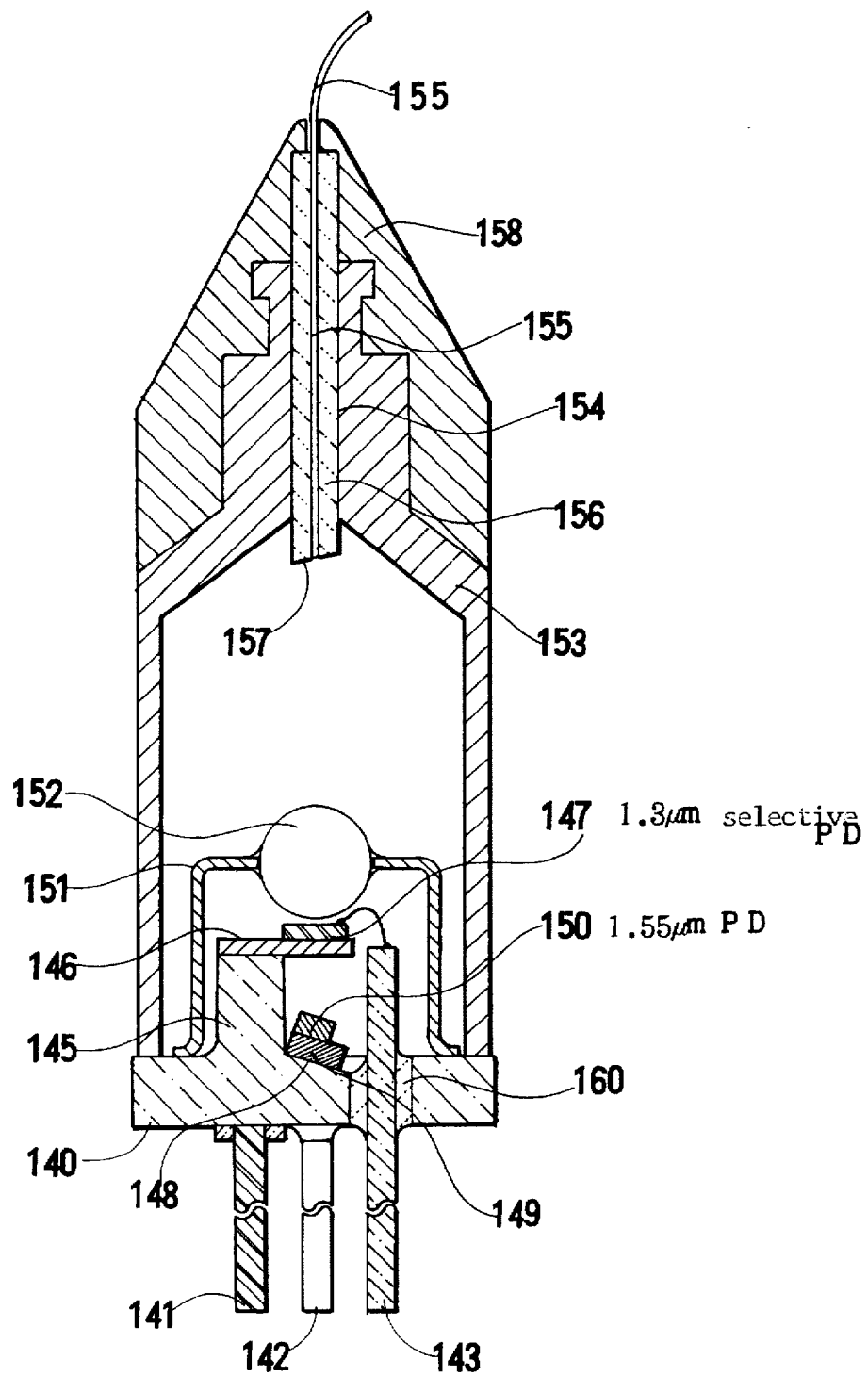
FIG. 16 is a perspective sectional view of a 1.3 μm/1.55 μm PD module of a sixth embodiment.

What has been explained are whole structures of various ONU modules having photodiodes, a coupler and a laser diode. From now on, important parts building a PD/LD module are clarified. FIG. 16 denotes an example of a PD module which is adopted in the PD/LD module of FIG. 15. Unlike an ordinary PD module, this PD module contains two photodiodes in series. A circular header (140) has four lead pins (141), (142), (143) and (144). A protrusion (145) is formed on the header (140) for supporting a first photodiode chip (147). A partially-transparent submount (146) is fitted on the top of the protrusion (145). The 1.3 μm-selective photodiode (147) is mounted on the submount (146). A slope (148) is shaped on the center of header (140). A submount (149) is fixed on the slope (148). A photodiode chip (150) for detecting 1.55 μm light is die-bonded on the submount (149). The surface of the PD (150) inclines to the beam line. Since the PD is oblique, beams reflected by the PD chip do not return along the same path as the incident beam. Pads of the second 1.55 μm PD chip (150) are wirebonded with lead pins for biasing the PD (150). Pads of the first 1.3 μm PD (147) are, similarly wirebonded with other leads.

A cap (151) with an opening is welded on the header (140). A ball lens (152) is fixed on the opening of the cap (151). The cap (151) encloses both the PD (147) and the PD (150) with the header (140). The center axis of the lens (152), the center of the 1.3 μm PD (147) and the center of the 1.55 μm PD (150) are aligned on a straight line. A cylindrical ferrule holder (153) is welded on the header (140) at the bottom. The ferrule holder (153) encloses the cap (151). The top of the ferrule holder (153) is shrunk through a shoulder to a head part. A small hole (154) is axially perforated in the head part of the holder (153). A ferrule (156) holds an end of a single-mode optical fiber (155). The front end of the ferrule (156) was ground at a slanting angle of eight degrees for inhibiting the reflected beams from propagating in the same fiber. The ferrule (156) is inserted into the axial hole (154) of the holder (153) and is fixed in the hole (154) at a suitable height.

19

A bend-limiter (158) made of elastic material is attached on the head part of the ferrule holder (153) in order to protect the optical fiber from excess bending.

The feature of the module is the linear disposition of the 1.3 µm PD (147) and the 1.55 µm PD (150). Two photodiodes do not exist at bisected different paths but align on the same axial line in series. Both photodiodes (147) and (150) are optically connected via the lens (152) to the optical fiber (155).

The reason why the second photodiode (150) is slanting to the optical axial line is to forbid the light reflected at the second PD (150) from returning to the light source (not shown) through the fiber (155). In the example, the 1.3 µm-selective photodiode (147) is not oblique to the optical axial line. It, however, is possible to incline the first PD (147) by slanting the submount (146).

The method of production is explained now. The header (140) is made from iron, covar, copper-tungsten or other metal. Here the header has four lead pins at the bottom. A slanting plane (148) is formed at the center of the top surface of the header (140). A ceramic submount (149) (e.g., alumina) is soldered up on the slanting plane (148) by a solder. Suitable solder is, for example, AuSn, SnPb, or AuGe solder. The embodiment adopts AuSn solder. Then a photodiode having sensitivity to 1.55 µm whose receiving layer is InGaAsP is soldered on the submount (149) by a solder.

Another ceramic submount (146) is also soldered on the top of the protrusion (145). The n-electrode and the p-electrode of the 1.55 µm PD (150) are electrically connected to the lead pins of the header by golden wires. The lead pins enable an external circuit to apply a bias on the PD (150) and to extract a photocurrent from the PD (150) via the wires. One pin (141) of the four lead pins is the ground (case, common) pin. The above steps are similar to the production process of a conventional photodiode. There are some alternatives for the materials of the submount (149), the solder, the wire and the header (140).

The assembly of newly-installed parts is explained hereinafter. A ceramic submount (146) of e.g., alumina $Al_2O_3$ or aluminum nitride AlN is metallized on both surfaces. Gold is further plated on the metallized surfaces. The submount (146) has a rectangular opening for guiding the light from the fiber to the PD (150). The width of the opening is slightly wider than the receiving area of the 1.3 µm-selective chip.

This example selects a 1.3 µm-selective PD chip (147) with a round receiving area of a 200 µm diameter. Then, the width of the opening is 250 µm. The length of the opening is 500 µm which is equal to the side of the PD chip (147). The submount (146) is fully metallized on both surfaces. A partially metallized submount is also available. The rectangular opening can be replaced by a circular one.

Both the submounts (146) and (149) have a thickness of 500 µm. The 1.3 µm-sensitive photodiode chip (147) is soldered by AuSn solder on the submount (146) so as to locate the center of the light receiving region of the PD on the opening of the submount (146). The submount (146) is soldered on the top of the protrusion (145) by SnPb so as to adjust the center of the opening to the beam line.

Since both surfaces of the submount (146) are metallized, the n-electrode on the bottom is connected to the ground pin (142) only by soldering the submount (146) on the protrusion (145). The position of the submount (146) is easily located by adjusting the end side of the submount (146) with the rear wall of the protrusion (145). The p-electrode of the PD (147) is wirebonded with the lead pin (143). The pins are fixed in the holes by an insulating adhesive (160) except the case pin (141).

20

A cap (151) with a ball lens (152) is fitted on the header (140) by the processes of pressing the cap (151) against the header (140), filling the inner space with an inactive gas e.g., nitrogen gas or argon gas, and welding whole the periphery of the cap on the header for keeping the inner space airtight. In the example, a ball lens of BK-7 glass has been fixed on an opening of a cap. Such a cap with a lens has been frequently used in an assembly of photodiodes. The caps are usually fixed by electric welding (or resistor welding) on the header. This embodiment also fixes the cap by electric welding. Alternately, the cap can be mounted on a header by YAG (laser) welding. Sufficient wideness of the receiving region of the photodiodes eliminates the necessity of alignment of the photodiodes for the beam line. Such a PD module is suitable to the 1.3/1.55 PD module (136) in FIG. 15. The PD module of FIG. 16 is novel itself. Thus, the module has been explained here as an important part of an ONU module of this invention.

[EMBODIMENT 7; Half-mirror wavelength selective coupler type]

In all the embodiments mentioned, optical couplers divide incident light power exactly into two exact halves 50% and 50%. The optical coupler equally divides the 1.3 µm light and 1.55 µm light into halves. The coupler is indispensable for the ONU modules to send and receive 1.3 µm light bidirectionally. The coupler, however, is nothing but an obstacle of reducing the incident power by half from the standpoint of the 1.55 µm light signals. The ONU module receives analog signals of 1.55 A m but sends no 1.55 µm light upward. The 1.55 µm signals need no coupler, since what requires the coupler is the bidirectional transmission. It is inconvenient for the 1.55 µm light that the coupler decreases the light power to a half, because the 1.55 µm light transmits TV signals to ONUs. 50% of power loss is about −3dB. −3dB is reduced to a loss of 10 km of a quartz optical fiber. Such a vast loss is induced by the insertion of the coupler.

In some cases, it may be earnestly desired that the 1.55 µm light should be received without a significant loss. For example, such a request would be strong, when TV signals should be sent to the ONUs which are far distant from the broadcasting station. In response to the request, another example which enables the distant ONUs to receive the 1.55 µm light more clearly is given next.

Figure 17A:
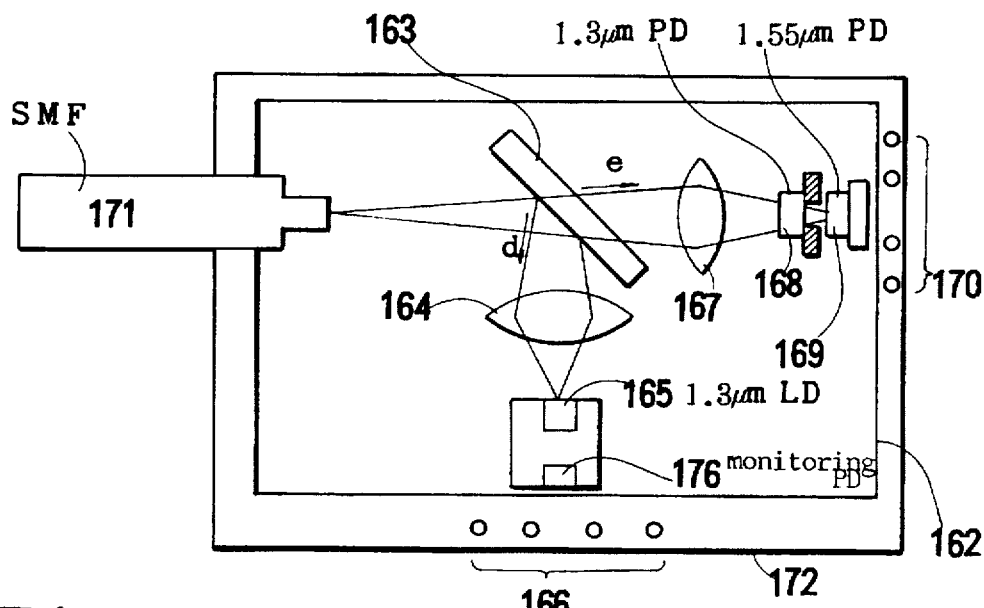
FIG. 17(a) is a schematic view of a half-mirror coupler type ONU module of a seventh embodiment.

FIG. 17 demonstrates the embodiment. Fundamental structure is similar to embodiment 1 of FIG. 11. The half-mirror coupler (93) is replaced by a half-mirror (163) with wavelength selectivity in the example. This embodiment builds a module on a ceramic plate (162) on which wiring patterns are printed. The wiring patterns made of copper play the role of the metal substrate on which devices are die-bonded and the role of the electric wirings for connecting various devices electrically.

The ceramic plate (162) holds a wavelength-selective half-mirror (163), a converging lens (164), a 1.3 µm emanating laser diode LD (165), a converging lens (167), a 1.3 µm-selectively sensing photodiode PD (168) and a 1.55 µm photodiode (169). The 1.3 µm laser diode (165) is provided with a monitoring photodiode (176) at the back. The monitoring PD (176) detects the power of the laser diode (165) for keeping the laser output at a constant power, since the fluctuation of the laser power induces noise. The plate (162) is sealed in a package (172). The package has lead pins (166) for the LD (165) and the monitoring PD (176) in the vicinity of the LD (165).

A single-mode fiber SMF (171) which communicates with the broadcasting station is optically coupled to the half-mirror (163). The digital sending signals generated by the laser diode (165) are converged by the lens (164), are reflected by the half-mirror (163). Then the upward light enters the fiber (171).

On the contrary, the light from the fiber (171) passes the half-mirror (163), a lens (167) and reaches a 1.3 μm-selective photodiode (168). The 1.3 μm light is detected and fully absorbed by the first photodiode (168). The rest, 1.55 μm light, arrives at the second 1.55 μm photodiode (169) which transduces the 1.55 μm light to a photocurrent.

Figure 17B:
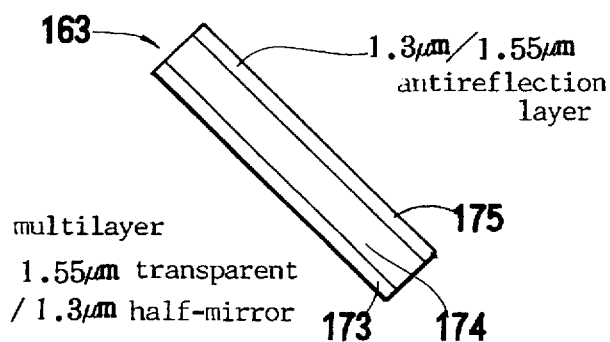
FIG. 17(b) is a section of the half-mirror.

The half-mirror has special wavelength selectivity in the embodiment. FIG. 17(b) shows a section of the half-mirror (163). The half-mirror (163) is consist of a multilayered film (173), transparent substrate (174) and an antireflection film (175) in turn from the side of the incident beams. The multilayered film (173) has an asymmetric function of perfect transparency for 1.55 μm light but of partial reflection of 1.3 μm light. What is required for the half-mirror is non-reflection of 1.55 μm light. A multilayered film is made by depositing in turn two kinds of dielectric layers with different refractive indices and different thicknesses. A pertinent choice of the refractive indices enables the multilayered film to reflect totally, to reflect in half or not to reflect at all the light of an arbitrary wavelength. Here, the material and the thickness of the dielectric layers should be selected under the condition of non-reflection of 1.55 μm.

The preferable condition is zero-reflection of 1.55 μm and half-reflection of 1.3 μm (transparency=50%) for the multilayered film. Imposition of the double conditions seems to make the design of the film difficult. The design is not impossible. The two conditions are not contradictory. Besides, it is not necessarily to divide 1.3 μm light into exact halves. In many cases, the received (downward) 1.3 μm light power is sufficient but the sending (upward) 1.3 μm light power is insufficient. In these cases, it is desirable to give asymmetric dividing ratio to the PD-path and the LD-path. For example, 20% is allotted to the PD path and 80% is allocated to the LD path in an improved coupler. Although the rigorous condition (zero-reflection) is imposed on the 1.3 μm light, it is feasible to find out the parameters of the dielectric layers for realizing non-reflection of 1.55 μm light, since the requirement from the 1.3 μm allows a wide margin.

In reality, it is far difficult to satisfy the conditions of a 50% transparent, 50% reflective half-mirror both for 1.3 μm and 1.55 μm. The difficulty originates from the imposition of two rigorous conditions. It is rather facile to make a dielectric multilayer which is entirely transparent for 1.55 μm, since the number of the necessary conditions is essentially one.

The materials of making the multilayer are, for example, silicon oxide ($SiO_2$), aluminum oxide ($Al_2O_3$) or titanium oxide ($TiO_2$) or other dielectrics. The rear surface of the half-mirror is coated with a 1.3 μm/1.55 μm antireflection film. The wavelength selective half-mirror (163) allows 1.55 μm light to pass the half-mirror without loss and to arrive at the 1.55 μm PD (169) with a stronger power than the conventional 1:1 half-mirror (4) in FIG. 3. Since the 1.55 μm power is strengthened by the use of asymmetric mirror (163), the quality of televisions is enhanced by a reduction of noise.

Figure 17C:
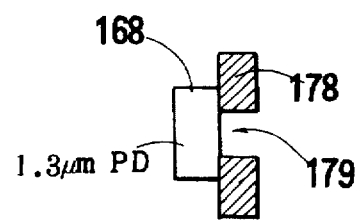
FIG. 17(c) is a sectional view of mounting a 1.3 μm PD on a submount.

As demonstrated in FIG. 17(c), the 1.3 μm-selective PD (168) is soldered on a ceramic submount ($Al_2O_3$ or AlN) (178) having a window (179) at the center. The surfaces and sides of the submount (178) have Au-metallized patterns which are respectively connected to the n-electrode and the p-electrode of the PD (168). The metallized patterns are soldered to the wiring patterns formed on the ceramic plate (162). Each wiring pattern on the plate (162) is wirebonded with some of the lead pins (170) for the photodiodes (168). The electrodes of the 1.55 μm photodiode (169) and the 1.3 μm laser diode (165) are connected to the lead pins (170) and (166) by the similar manner.

The 1.3 μm laser diode (165) is followed by a photodiode (176) for monitoring the power of the laser diode (165). The LD (165) and the PD (176) are mounted on a heat sink which is made from e.g., SiN with high heat conductivity. Since a large current flowing in the LD (165) generates big Joule heat, the LD (165) must be cooled by the heat sink. The heat sink can be also made with a metal. A metal heat sink, however, must be insulated by some means from the electrodes of the LD (165) and the PD (176).

The lenses (164) and (167) are mounted on holders. The holders are fitted on the ceramic plate (162). The package (162) holding all the parts is made from metal, e.g., iron, covar or braze.

Figure 3:
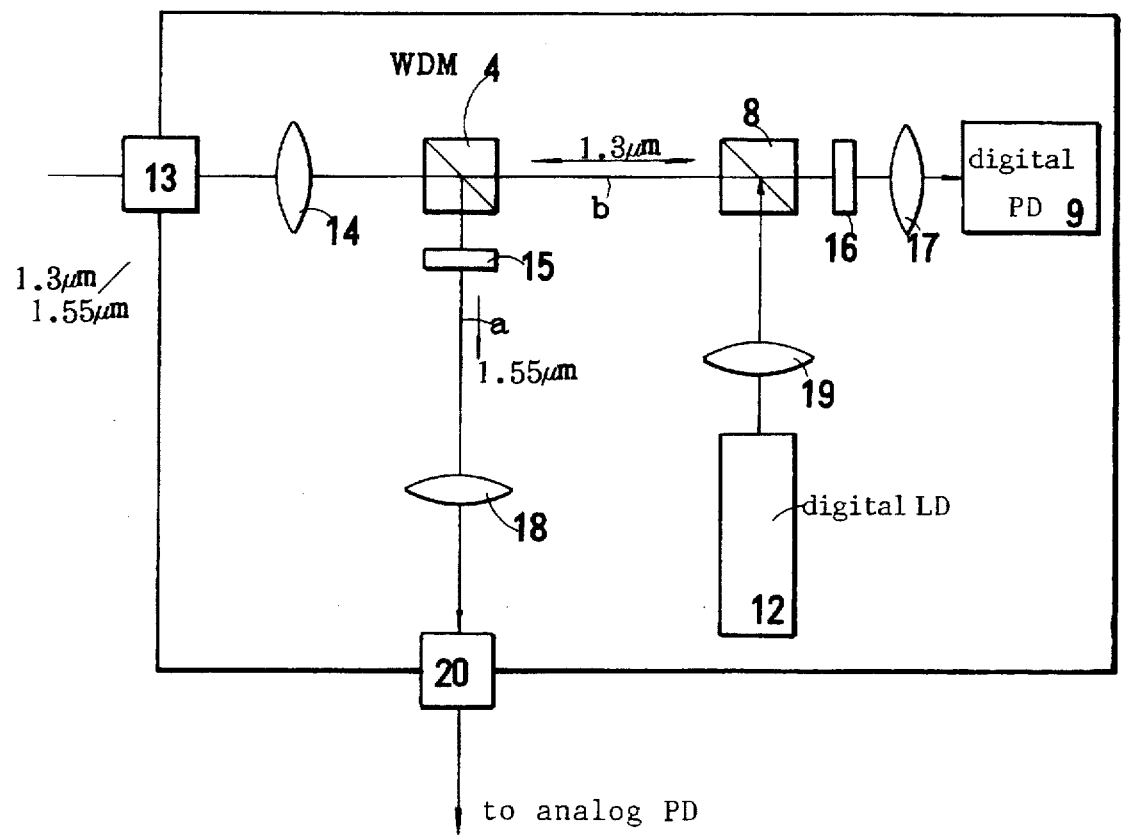
FIG. 3 is a simplified view of a prior ONU module having a mirror coupler and a mirror wavelength division multiplexer (WDM).

Embodiment 7 (FIG. 17) corresponds to the prior art denoted in FIG. 3. Although both modules use a mirror coupler for dividing or combining the upward light and the downward light, embodiment 7 succeeds in curtailing the cost of production by reducing the number of parts and simplifying the structure. The performance as an ONU module, however, is not inferior to the prior one of FIG. 3. What brings about such a strong point? It is a new idea of the linear, serial alignment of two photodiodes in contradiction to all the prior modules requiring the bisection of 1.3 μm path and 1.55 μm path.

[EMBODIMENT 8: Wavelength selective planar waveguide type]

Figure 18A:
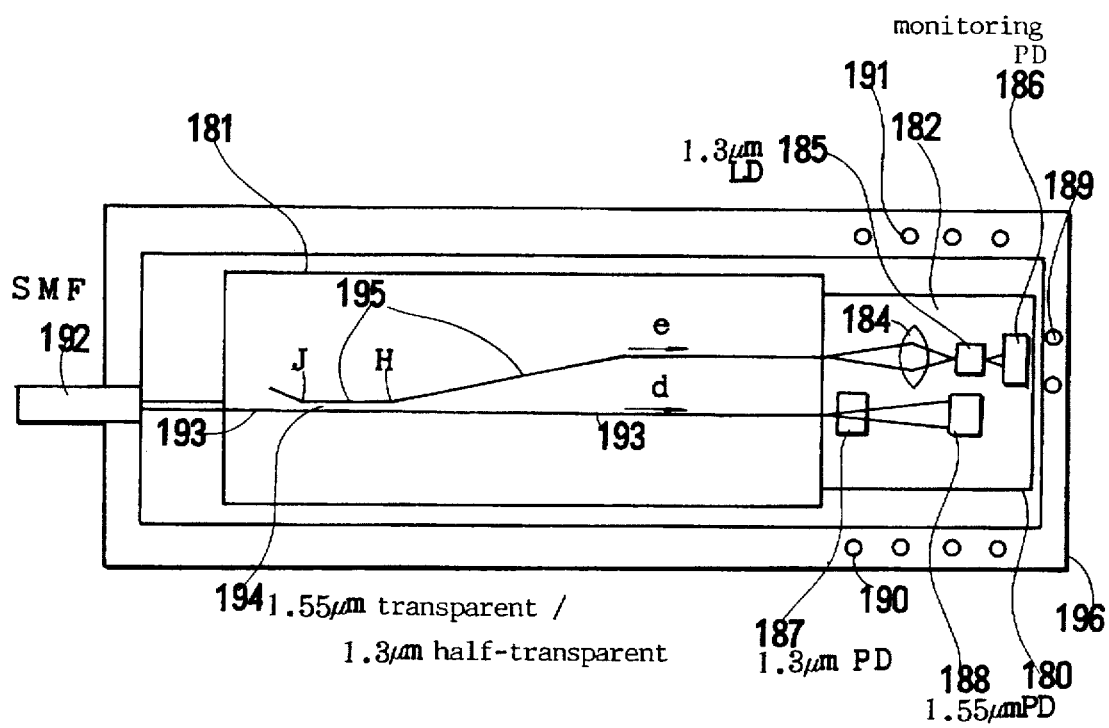
FIG. 18(a) is a schematic view of a wavelength-selective waveguide coupler type ONU module of an eighth embodiment.

FIG. 18(a) denotes another embodiment making the optical coupler by a wavelength selective planar waveguide. The embodiments of FIG. 13 and FIG. 14 employ the couplers of a planar waveguide type. The planar waveguide has no wavelength selectivity, because the waveguide adopts a simple Y-bisection. As explained with regard to embodiment 7 of FIG. 17(a), wavelength selectivity is sometimes demanded for the coupler. This embodiment is the most suitable one for such a request because of the wavelength selectivity endowed to the bisection of the waveguide.

Figure 4A:
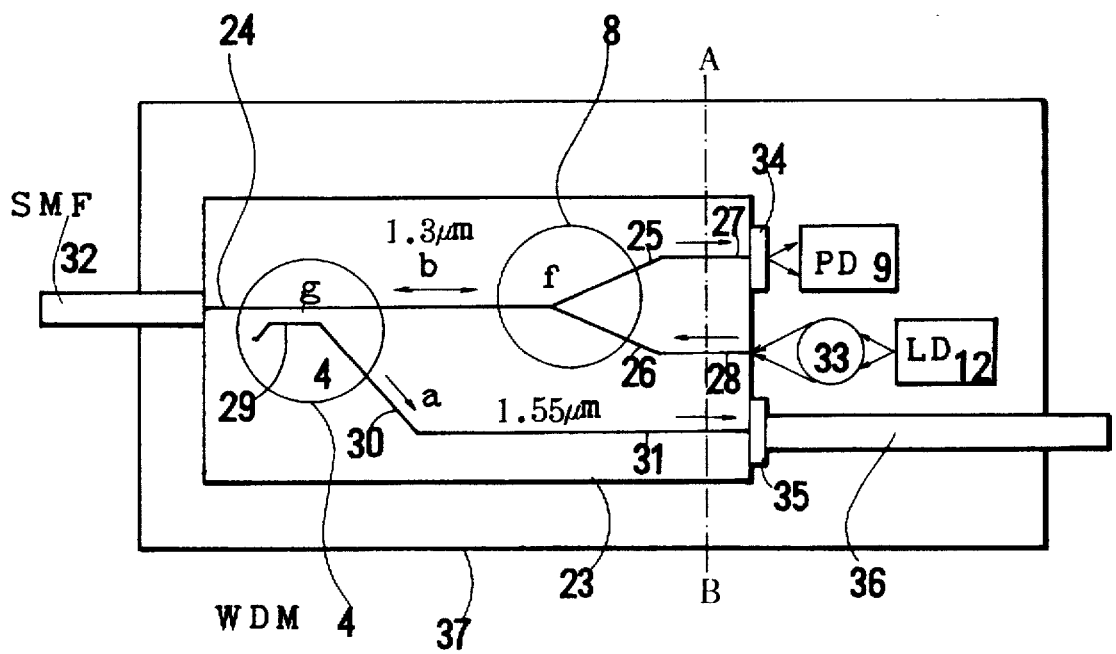
FIG. 4(a) is a simplified view of a prior ONU module having a quartz planar waveguide coupler and a quartz planar waveguide wavelength division multiplexer (WDM).
Figure 4B:
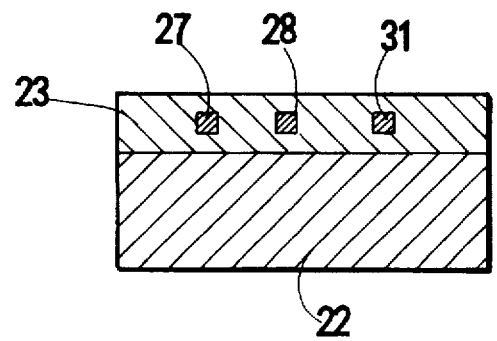
FIG. 4(b) is a section of FIG. 4(a).
Figure 5:
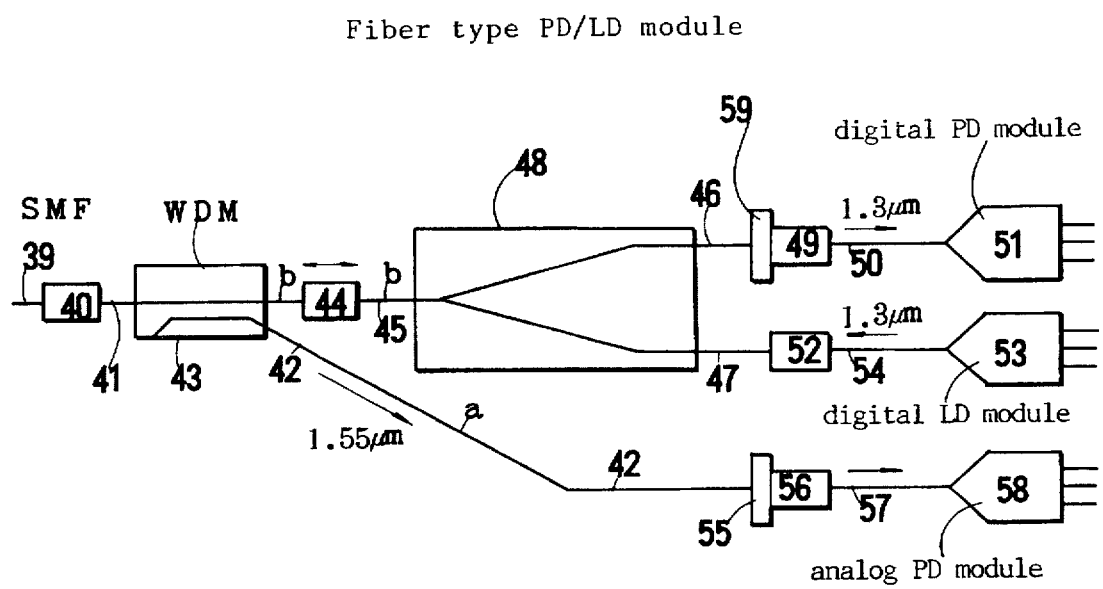
FIG. 5 is a simplified view of a prior ONU module having an optical fiber coupler and an optical fiber wavelength division multiplexer (WDM).

A base plate (180) is a rectangular plate made from e.g., ceramic. A quartz waveguide (181) is glued on a front half of the plate (180). The waveguide (181) has the same structure as the waveguide FIG. 4(b) which shows the sectional view. A cladding layer is deposited on a Si substrate. Core parts having higher refractive index are linearly formed in the cladding layer. The core parts become paths for guiding light.

A submount (182) is die-bonded on a rear half of the plate (180). The submount (182) is a ceramic plate metallized with electrical wiring patterns and parts-mount patterns. A lens (184), a 1.3 μm laser diode (185) and a monitoring photodiode (186) are aligned in series on the submount (182). In parallel with them, a 1.3 μm-selective photodiode (187) and a 1.55 μm photodiode (188) are aligned on a straight line on the submount (182). A plurality of lead pins (189), (190) and (191) are planted on the periphery of the package (196) for connecting the electrodes of the device chips and external circuits. The broadcasting station sends 1.3 μm signals and 1.55 μm signals by a single-mode fiber (192) to the ONU module. The final end of the fiber (192) is inserted into the package (196). The light travels once in free space and goes into an end of a path (193) on the quartz waveguide (181).

Another path (195) is made on the waveguide (181). A part JH of the second path (195) is quite close to a part of the first path (193). The part JH plays a role of exchanging the power between the path (195) and the path (193) by evanescent waves. Thus, the part JH acts as a coupler (194) of the paths (193) and (195). A selection of the length (L) and the gap (d) of JH freely determines the degree of power exchange for an arbitrary wavelength. Namely, the power transferred from the path (193) to the path (195) can be regulated by the wavelength (λ), the length (L) and the gap (d).

Figure 18B:
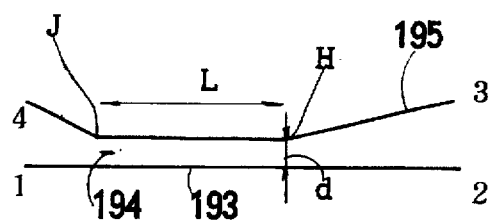
FIG. 18(b) is a plan view of the contiguous part of the waveguide paths.

FIG. 18(b) denotes the notations of the coupler. An inlet and an outlet of the path (193) are now called port 1 and port 2 for clarifying the modes of exchange of power. An inlet and an outlet of the path (195) are called port 4 and port 3. In general, $F_{mn}$ means a probability of transfer from port m to port n. For example, $F_{12}$ denotes the probability of the energy transfer from port 1 to port 2. $F_3$ designates the probability from port 1 to port 3. $F_{31}$ is the probability from port 3 to port 1 and so on. The energy conservation law gives sum rules $F_{12}+F_{13}=1$, $F_{21}+F_{24}=1$, $F_{31}+F_{34}=1$ and so forth. The reversibility of optical paths realizes the symmetry $F_{mk}=F_{km}$. The probability $F_{mk}$ is a function of the wavelength λ, the gap (d) and the length (L). Thus the probability can be denoted expressed as $F_{mk}$(λ, d, L).

In the coupler, it is desirable for the 1.55 μm not to enter the path (195). The requirement is simply represented by $F_{13}$(1.55 μm, d, L)=0.

The ratio 1:1 is not a good division ratio for 1.3 μm. Higher allotment for the path (195) communicating with the LD (185) than a half is desirable for the 1.3 μm light. The asymmetric condition is simply represented by an inequality $F_{13}$(1.3 μm, d, L)≦$F_{12}$(1.3 μm, d, L)>0

The length (L) and the gap (d) shall be determined for satisfying the conditions.

Figure 18C:
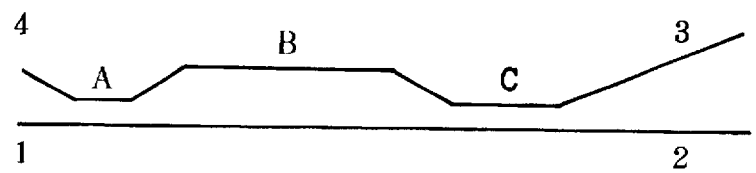
FIG. 18(c) is a plan view of a Mach-Zehnder type wavelength selective coupler.

FIG. 18(c) shows a Mach-Zehnder type coupler in which two paths (1→2) and (4→3) approach with together at a region (A) and another region (C), but separate at a region (B). Two paths couple to each other at the region (A) and (C) by evanescent waves which are tails of wave functions of the light. The curved path (4→3) is slightly longer than the path (1→2) between the points (A) and (C). The difference Δ between the path (4→3) and the path (1→2) is constant. If Δ is a certain integer times as long as a wavelength λ, the couplings at (A) is strengthened by the coupling at (C). If Δ is a certain half-integer times as long as a wavelength λ, the coupling at (C) is canceled by the coupling at (A).

For the reason, the transition probability $F_{13}$ changes as a function of the wavelength λ. Thus, the Mach-Zehnder type coupling can give wavelength selectivity to the coupler. Since the Mach-Zehnder type coupling of FIG. 18(c) has more number of parameters than the simple coupling of FIG. 18(b), the Mach-Zehnder type is the most suitable for the purpose of forbidding 1.55 μm from transferring ($F_{13}$(1.55 μm)=0) and for compelling 1.3 μm to transfer (($F_{13}$(1.3 μm)>$F_{12}$(1.3 μm)).

This embodiment has advantages of a good congeniality with an optical fiber, a probability for minimizing the size and a probability of producing a plenty of equivalent chips on a silicon wafer by photolithgraphy. The embodiment excels in the wavelength sensitivity besides these advantages.

The kernel of embodiment 8 is the waveguide type coupler having the wavelength selectivity. Thus, the structure of the waveguide type coupler is explained in detail.

Figure 19A:
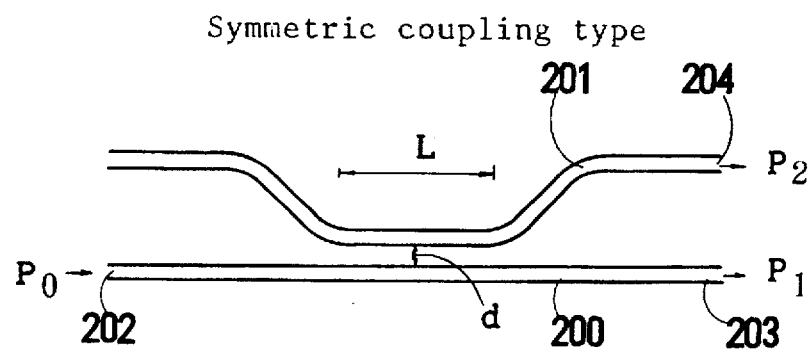
FIG. 19(a) is a plan view of a symmetric directional coupler made on a waveguide.
Figure 19B:
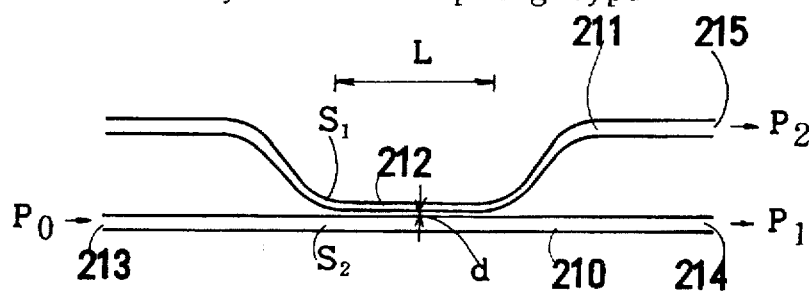
FIG. 19(b) is a plan view of an asymmetric directional coupler made on a waveguide.
Figure 19C:
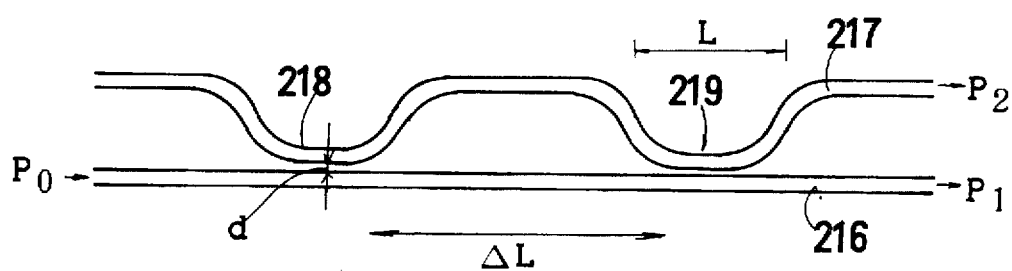
FIG. 19(c) is a plan view of a Mach-Zehnder type directional coupler made on a waveguide.

FIG. 19(a), FIG. 19(b) and FIG. 19(c) show examples of the couplers. All the examples produce paths (cores) by doping an impurity of a higher refractive index continually into the cladding. The example uses 1.31 μm light which is the most pertinent to a long distance transmission by a quartz fiber as the 1.3 μm-band light.

FIG. 19(a) is a figure of a symmetric coupling type which consists of a linear path (200) and a curved path (201). A part (L) of the path (201) is close to the linear path (200) with a narrow gap (d). Two paths are equivalent with regard to the sectional view and the refractive index. The parallel cores with the gap (d) and the length (L) make a directional coupler. Oozing beyond the cores through the overlapping of the wave functions, light power transfers from one path to the other path gradually according to the advance in the coupler. When two parallel cores have the same diameter and the same refractive index, the power moves from the path (200) to the path (201) at first and returns from the path (201) to the path (200). The energy oscillates between the path (200) and the path (201). The speed of the transition depends upon the wavelength. The incident power $P_0$ at an inlet (202) can be divided to the power $P_1$ to an outlet (203) and the power $P_2$ to another outlet (204) at an arbitrary ratio $P_1$:$P_2$ by adjusting the length (L) and the gap (d) of the coupler. The ratio $P_1$:$P_2$ is contingent on λ, L and d. When $P_0$ is normalized to be 1($P_0$=1), $P_1$=$F_{12}$ and $P_2$=$F_{13}$. This embodiment determines L and d to satisfy the conditions of dividing the 1.55 μm input power $P_0$=1 to output power $P_1$=1 and $P_2$=0 and of dividing the 1.31 μm input power $P_0$=1 to output power $P_1$=0.5 and $P_2$=0.5.

Figure 20:
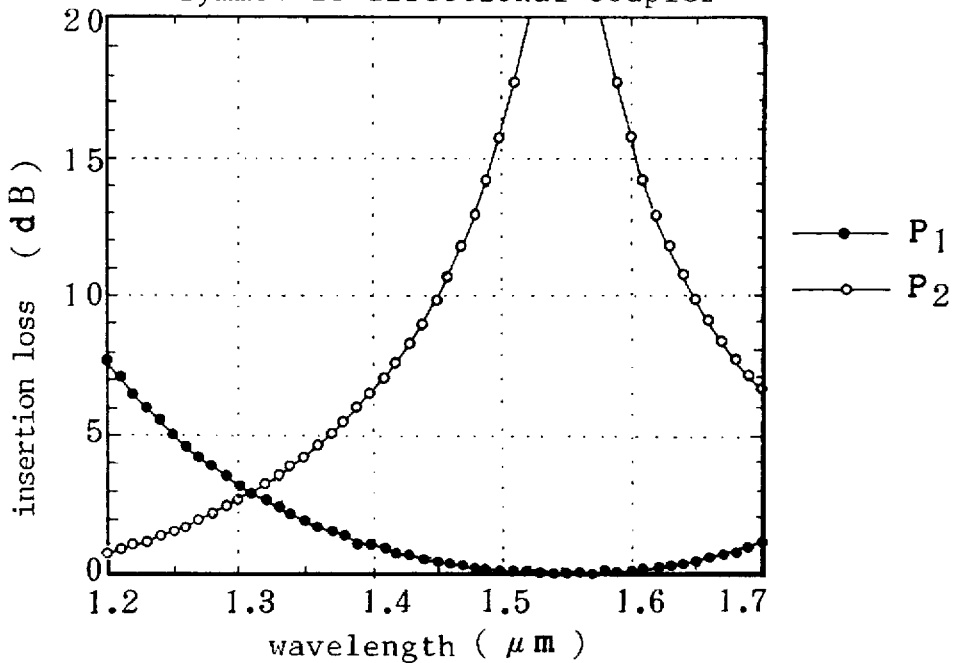
FIG. 20 is a graph showing the wavelength-dependence of the insertion-loss of a waveguide symmetric directional coupler. The abscissa is a wavelength(μm). The ordinate is an insertion loss (dB). Black dots denote $P_1$. Blank dots denote $P_2$.

FIG. 20 is the graph of the relation of the insertion loss to the wavelength (μm) of the symmetric directional coupler of FIG. 19(a) on the parameters d and L determined by the aforementioned conditions ($P_1$:$P_2$=1:0 for 1.55 μm, $P_1$:$P_2$= 1:1 for 1.3 μm). The abscissa is the wavelength (μm). The ordinate is the insertion loss (dB). Black dots denote losses of $P_1$. Blank dots designate losses of $P_2$. The loss is $P_0$–$P_1$ or $P_0$–$P_2$. The logarithmic representation $\Delta_1$ or $\Delta_2$ is $\Delta_1$=20log{($P_0$–$P_1$)/$P_0$} or $\Delta_2$=20log{($P_0$–$P_2$)/$P_0$}. What are depicted on the figure are $\Delta_1$ and $\Delta_2$. At λ=1.55 μm, the loss $\Delta_2$ diverges ($P_2$=0) but the loss $\Delta_1$ is zero ($P_1$=1). At λ=1.31 μm, $\Delta_1$=$\Delta_2$($P_1$=$P_2$). Since two curves cross at the point, a small deviation of wavelength from 1.31 μm changes the sign of ($\Delta_1$–$\Delta_2$). Namely the balance $\Delta_1$=$\Delta_2$($P_1$=$P_2$)is unstable in the vicinity of 1.31 μm.

Of course, $P_1$=$P_2$ at 1.3 μm is not a necessary condition. As explained before, sometimes it is preferable for the input path to couple more strongly to the upward path. In the case, $P_1$/$P_2$<0.5 shall be realized by a selection of the parameters d and L. In the simple directional coupler of FIG. 19(a), both $\Delta_1$ and $\Delta_2$ are simple functions of λ. Separate controllability of 1.3 μm power and 1.55 μm power originates from the principle that the propagation constant (or phase constant) in a core changes as a function of wavelength. The exchange of power between two parallel paths ha s been explained, for example, by (7) Hiroshi Nishihara et al.,"Optical Integrated Circuit", Ohm corporation February 1985, p55–p63.

FIG. 19(b) denotes an asymmetric directional coupler, which has a linear path (210) and a curved path (211) which is contiguous to the path (210) at a part (212). The core of the path (211) is locally narrowed at the contiguous part (212). In the coupler, all the power $P_0$ introduced from an inlet (213) does not fully transfer to t h e path (211) for any selection of parameters d and L. When the transferred power is maximized, some power still remains in the original path (210). The maximum power which the path (211) can obtain from the path (210) is determined by the difference of the phase constants of the paths in the contiguous region (L).

Thus, the maximum $P_2$ can be controlled by selecting the core widths $S_1$ and $S_2$. The parameters d, L, $S_1$ and $S_2$ are chosen for satisfying two conditions. One condition is that the maximum transfer from $P_0$ to $P_2$ is 50% for 1.3 µm. The other condition is that $P_2$=0 for 1.55 µm. Like the coupler of FIG. 19(a), $P_1$:$P_2$=1:1 for 1.3 µm and $P_1$:$P_2$=1:0 for 1.55 µm are the conditions of determining the parameters d, L, $S_1$ and $S_2$ of the asymmetric directional coupler of FIG. 19(b).

Figure 21:
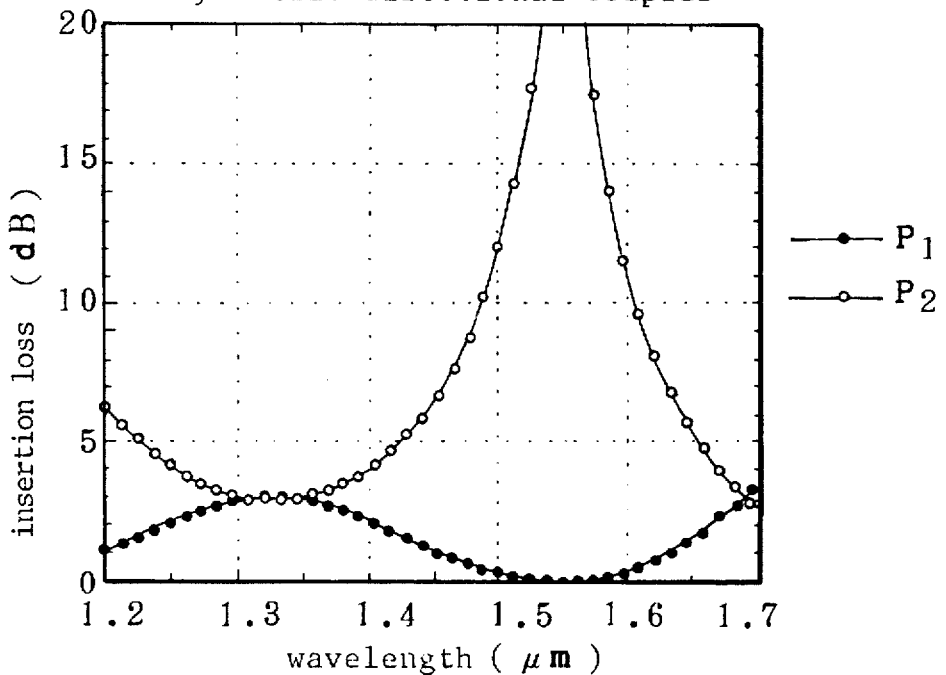
FIG. 21 is a graph showing the wavelength-dependence of the insertion-loss of a waveguide asymmetric directional coupler. The abscissa is a wavelength(μm). The ordinate is an insertion loss (dB). Black dots denote $P_1$. Blank dots denote $P_2$.

FIG. 21 is the graph of the insertion loss as a function of wavelength of the asymmetric directional coupler of FIG. 19(b). The abscissa is the wavelength. The ordinate is the insertion loss (dB). The balance $\Delta_1$=$\Delta_2$($P_1$=$P_2$) is realized at 1.31 µm. Both $P_1$ and $P_2$ take an extremity at 1.31 µm. The extremity gives the power with a big margin for accidental deviation from the predetermined value. The balance $\Delta_1$=$\Delta_2$ ($P_1$=$P_2$) is stable for the fluctuation of the wavelength from 1.31 µm.

FIG. 19(c) shows a Mach-Zehnder type coupler which has been depicted in FIG. 18(c). This type has two contiguous parts (218) and (219). "d" is the gap and "L" is the length of the contiguous parts. "ΔL" denotes the distance between two contiguous parts. The freedom of design is enhanced by an increase of the number of parameters.

[EMBODIMENT 9: Wavelength selective optical fiber coupler type]

Figure 22:
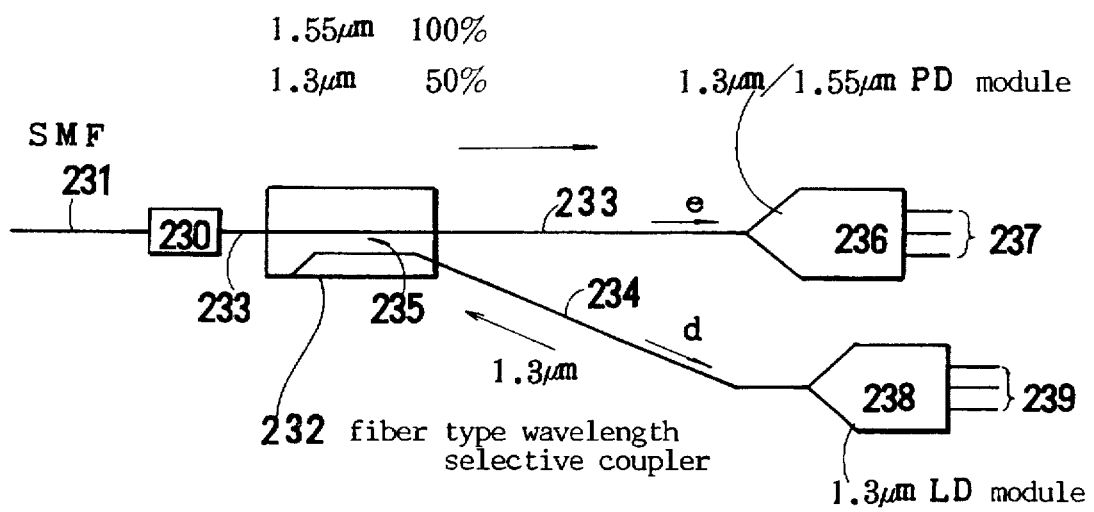
FIG. 22 is a schematic view of a wavelength-selective optical fiber coupler type ONU module of an ninth embodiment.

Embodiment 8 adopted a coupler which is endowed with wavelength selectivity by a planar waveguide. It is possible to make a coupler having wavelength selectivity with optical fibers. FIG. 22 shows the embodiment using fiber type coupler with wavelength selectivity. A single-mode fiber (231) leads to the broadcasting station. The fiber (231) is coupled to an optical connector (230) of an ONU module. A fiber (233) originates from the connector (230). A fiber-type wavelength selective coupler (232) maintains a part of the fiber (233) and a part of another fiber (234) in a close position (235) for allowing two fibers to exchange light power. The rate of power exchange is contingent upon the wavelength, which brings about wavelength selectivity to the coupler (232). The wavelength selectivity is based on the same principle of the couplers of the planar waveguide type shown in FIG. 18 and FIG. 19.

The allocation ratios can be determined according to the object of the coupler. Embodiment 9 allocates the power to the fibers (233) and (234) at the ratios of (233):(234)= 50%:50% for 1.3 µm light and of (233):(234)=100%:0% for 1.55 µm. The fiber (233) leads to a 1.3 µm/1.55 µm PD module (236) which corresponds to the example of FIG. 16. The PD module (236) has lead pins (237) which are connected to external electric power sources, amplifiers or so. The other fiber (234) communicates with a 1.3 µm laser diode module (238) with lead pins (239). Telephones or facsimiles give electric, digital signals through the pins (239) to the laser diode module (238) which transduces the signals into optical ones.

The ratio (233):(234)=50%:50% is not a unique value for 1.3 µm. The power of the laser determines the preferable allocation. If the downward light has a sufficient power, the allocation shall be (233):(234)=30:70 or 20:80, which would alleviate the load on the LD (238). This example stores both the 1.3 µm photodiode and the 1.55 µm photodiode in the PD module (236). An alternative replaces the 1.55 µm PD outside the package and connects the external PD by a fiber to the 1.3 µm PD in the package.

All the embodiments which have been explained heretofore have used only a single fiber which admits the light to travel both upward and downward. Since a single fiber carries signal light bidirectionally, the module can contain both PDs and a LD in a package. The device is always a PD/LD module.

Figure 2:
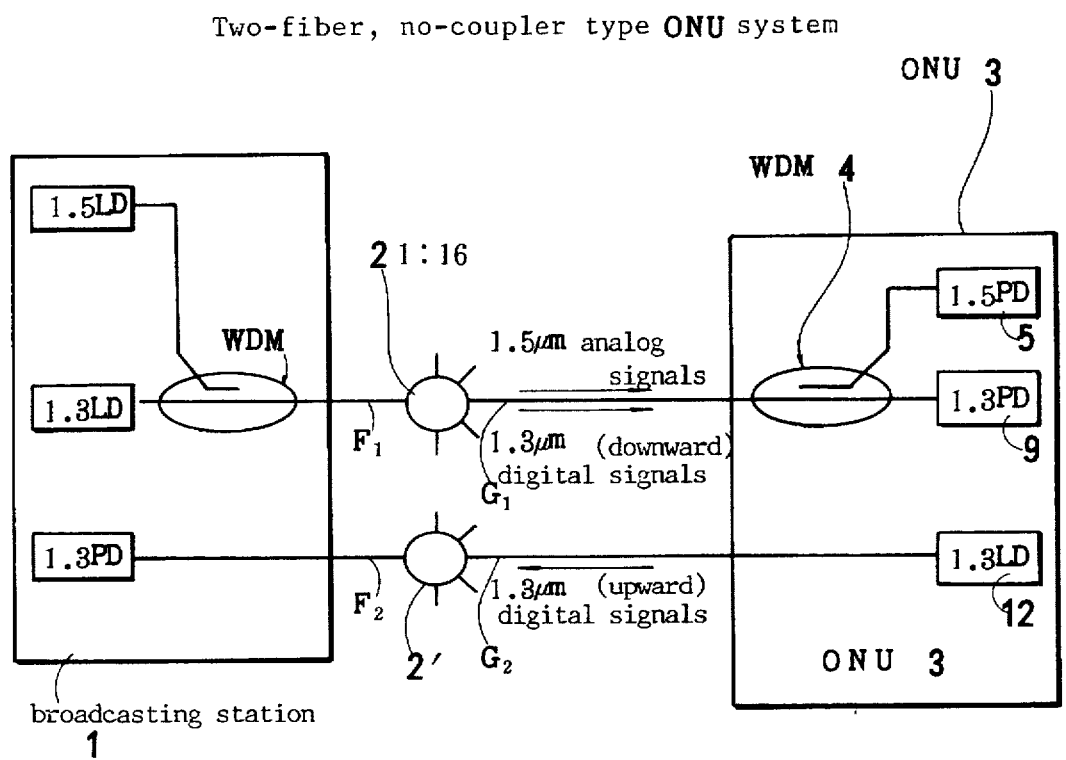
FIG. 2 is a schematic view of a prior bidirectional optical communication system transmitting bidirectionally optical signals of 1.3 μm and 1.55 μm in a downward optical fiber and a upward optical fiber between a broadcasting station and a plurality of ONU terminals.

The use of a single fiber, however, requires a coupler for integrating the upstream light and the downstream light. Embodiments explained are different in the kinds of couplers. The couplers are still expensive. An alternative should dispense with a coupler. The module without a coupler, however, requires two fibers for the bidirectional transmission. One fiber exclusively is allotted to upward light. The other fiber is exclusively assigned to downward light. Curtailment of a coupler invites an increase of the number of fibers. FIG. 2 denotes a prior two-fiber ONU system. This invention can be applied also to an improvement of the two-fiber system. Application of this invention to a two-fiber system succeeds in eliminating a coupler. The system may be called a two-fiber, non-coupler system.

Figure 23:
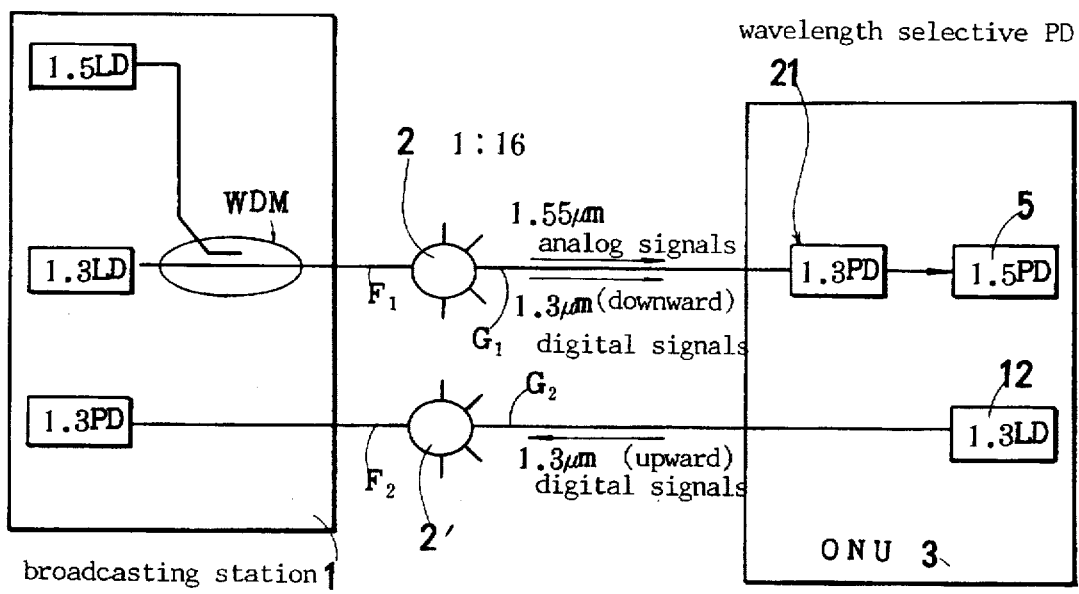
FIG. 23 is a schematic view of a bidirectional optical communication system of this invention for transmitting bidirectionally optical signals of 1.3 μm and 1.55 μm in a downward optical fiber and a upward optical fiber between a broadcasting station and a plurality of ONU terminals.

FIG. 23 shows a general structure of this invention applied to a two-fiber system. A broadcasting station (1) has a laser diode of 1.55 µm band, another laser diode of 1.3 µm and 1.3 µm photodiode. The downstream light from the 1.55 µm LD and the downstream light from the 1.3 µm LD are united by a wavelength division multiplexer (WDM) into a downward fiber ($F_1$). The 1.3 µm/1.55 µm light travels in the fiber ($F_1$) to a 1:16 distributor (2) which divides the light into 16 ONUs. Then the light propagates in a fiber ($G_1$) to an ONU. The light goes into a 1.3 µm-selective PD (21) which detects and absorbs 1.3 µm light. The rest, 1.55 µm light, goes out of the PD (21) and arrives at another PD (5) which detects the 1.55 µm light. This is the downward flow of light from the broadcasting station (1) to the ONU (3). Independent of the downward flow, upstream signals from a 1.3 µm laser diode (12) spread in a fiber ($G_2$) to a distributor (2') and propagate in a fiber ($F_2$) to a 1.3 µm PD in the station (1). The two-fiber system of this invention has a strong point of eliminating both WDMs and couplers. The upward flow has not a new device. Then, embodiments of a 1.3 µm/1.55 µm PD module are explained hereinafter.

[EMBODIMENT 10; Pig-tail type 1.3 µm/1.55 µm PD module]

The device in FIG. 16 has been explained as an element of a one-fiber PD/LD module. The same device, however, can be a candidate of an element of a two-fiber ONU. The fiber (115) substantially extends to the broadcasting station (1) without being combined with another upstream fiber.

[EMBODIMENT 11; receptacle type 1.3 µm/1.55 µm PD module]

Figure 24:
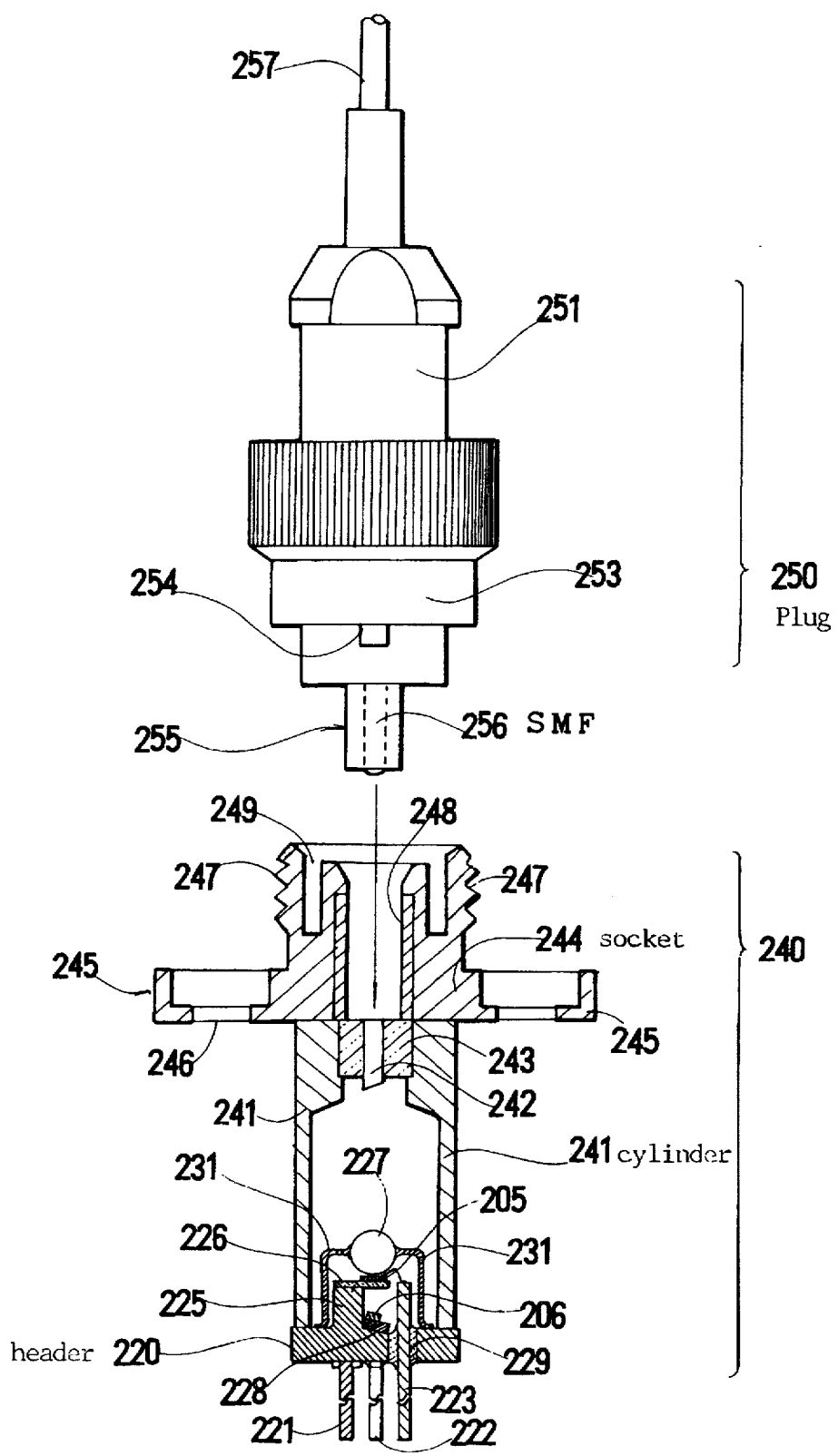
FIG. 24 is a partially sectioned view of a 1.3 μm/1.55 μm PD module of this invention of allowing the fiber to attach/detach to/from the PDs as an eleventh embodiment.

FIG. 24 shows a receptacle type PD module of an element of two-fiber, couplerless ONU system. The receptacle type is convenient to attach/detach a PD module to/from a fiber. The module consists of a receptacle (240) holding two PDs and a plug (250). The receptacle (240) has a header (220), a cylinder (241) and a socket (244) in series along a center line. The header (220) has a plurality of pins (221), (222).

. . . A 1.55 µm PD (206) is kept on a submount (228) slantingly fitted on the center of the header (220). Another submount (226) with an opening or a transparent part is soldered on the top of a protrusion (225) of the header (220). A 1.3 µm-selective PD (205) is fitted on the submount (226). A cap (231) with a lens (227) is glued on the header (220) for protecting the PDs (206) and (205). Inactive gas is filled in the cap. A cylinder (241) has a narrowed top which maintains a dummy fiber (242) through a holder (243). An end of the dummy fiber (242) has been polished obliquely for preventing reflected beams from returning to the laser diode. The other end of the cylinder (241) is welded to the header (220). The socket (244) has a flange (245) with screw holes (246) for fixing the receptacle (240), a male screw (247) cut on an outer surface, a sleeve (248) and axial holes (249) for determining the direction. The sleeve (248) has been made from a abrasion-resistant material e.g., zirconia.

The plug (250) has a housing (251), a union nut (253) and keys (254). A fiber cord (257) encloses a single-mode fiber (256) which is inserted into a ferrule (255). The ferrule (255) is made from e.g., zirconia. The keys regulate the relative direction of the plug to the receptacle (240) by inserting into the axial holes (249). The union nut (253) tightly connects the plug (250) to the receptacle (240) by fitting with the male screw (247). The tip of the fiber (256) has been polished to a round end. In the attached state, the end of the fiber (256) comes into contact with the rear end of the dummy fiber (242). Traveling in the fiber (256) and the dummy fiber (242), the downstream light from the broadcasting station (1) is converged by the lens (227). The light includes 1.3 μm light and 1.55 μm light. The 1.3 μm-selective PD (205) detects and absorbs all the 1.3 μm light. The 1.3 μm PD (205) produces a photocurrent in proportion to the 1.3 μm analog signals. The rest, 1.55 μm light, finally enters the PD (206) which transduces the 1.55 μm light into a photocurrent which is amplified and is sent to television sets. This embodiment has a strong point of easy attachment/detachment of the fiber to/from the photodiodes. This PD module can be used commonly by different fibers.

Figure 25:
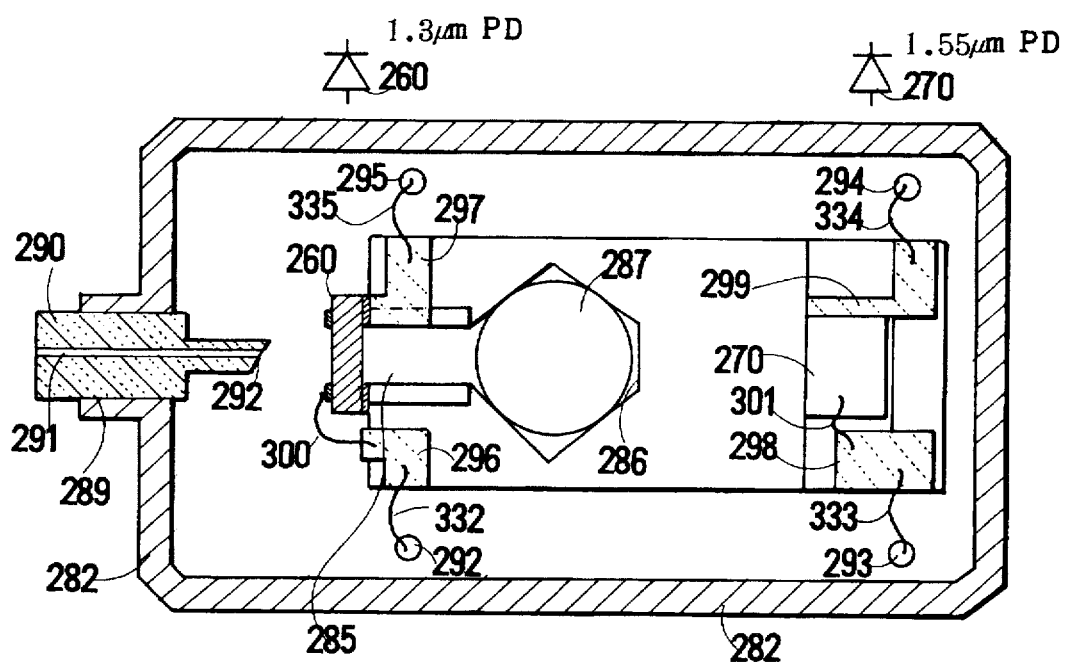
FIG. 25 is a horizontally-sectioned view of a 1.3/1.55 PD module stored in a rectangular package of a twelfth embodiment.
Figure 26:
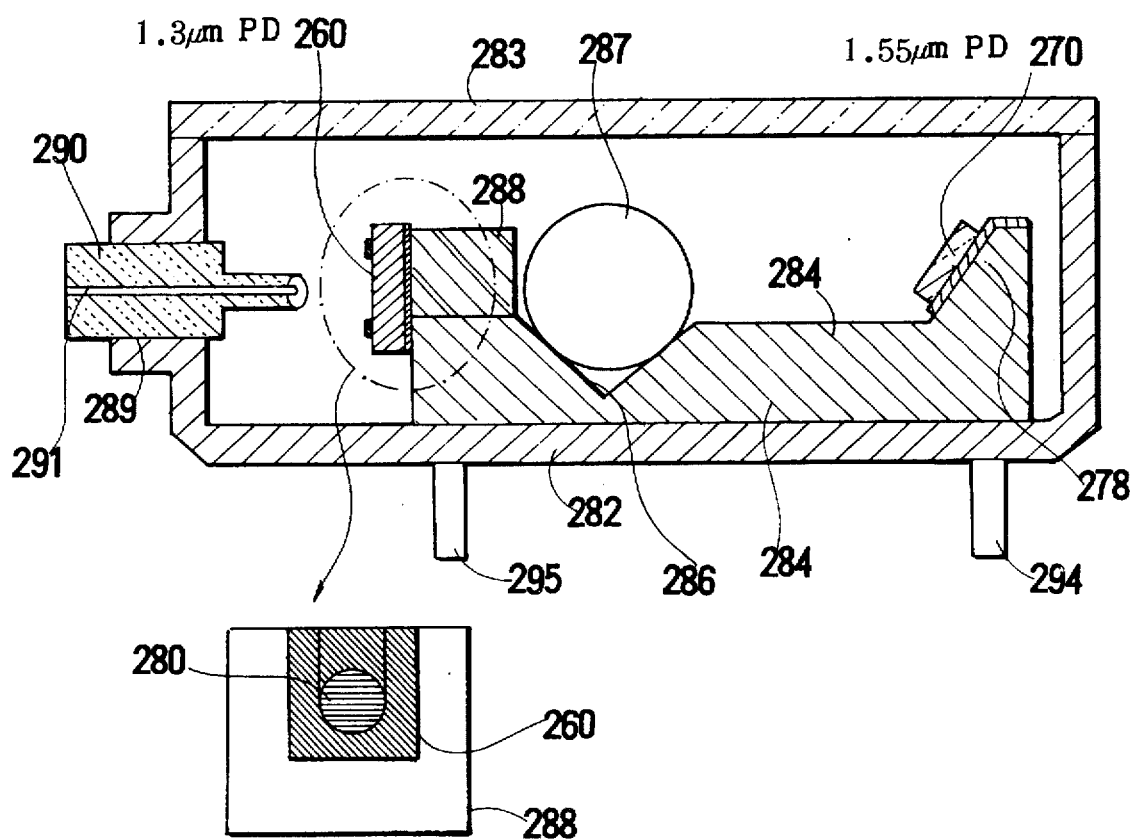
FIG. 26 is a vertically-sectioned view of the same module as FIG. 25.

[EMBODIMENT 12: PD module stored in a rectangular package] FIG. 25 and FIG. 26 show another 1.3 μm/1.55 μm PD module installed in a rectangular package. This module aligns a 1.3 μm selective photodiode (260) and an ordinary photodiode (270) for 1.55 μm in series on a beam line. Instead of the cylindrical receptacle, this embodiment stores the photodiodes (260) and (270) in a rectangular package (282) and a cap (283). Actually, an aluminum nitride (AlN) submount (284) holding the optoelectronic devices is fitted in the package (282).

The wavelength-selective 1.3 μm photodiode (260) is mounted at a front end of the submount (284) in parallel with the front side. The first photodiode (260) absorbs and senses only 1.3 μm. 1.55 μm light passes the PD (260) without loss. A groove (285) is cut in the axial direction from the front end of the submount (284). A hexagonal V-notch (286) is shaped next to the groove (285). A lens (287) is upholstered in the notch (286). The V-notch (286) positions the lens (287). A slanting protrusion (278) is formed at the rear end of the submount (284) and is metallized. The 1.55 μm PD chip (270) is die-bonded on the metallized protrusion (278).

The package (282) is provided with four pins (292), (293), (294) and (295) on the bottom. The pins are insulated from the package (282). An axial hole (289) is perforated at the front end of the package (282). An optical fiber cord (290) is inserted into the hole (289). A front end (292) which faces to the 1.3 μm PD (260) is slantingly cut in order to prevent the reflected beams from returning to the laser.

The hole, groove, protrusion and notch formed on the submount (284) facilitate the positioning of the parts. The submount (284) has four metallized wiring patterns (296), (297), (298) and (299). The n-electrode of the 1.3 μm PD (260) is soldered on the metallized pattern (297) which is connected via a wire (335) to the pin (295). The p-electrode of the same PD (260) is joined to the pattern (296) by a wire (300). The metallized pattern (296) is connected to the pin (292) by a wire (332). The n-electrode of the 1.55 μm photodiode (270) is soldered on the metallized pattern (299) which is connected to the pin (294) by a wire (334). The p-electrode of the same PD (270) is joined with the pattern (298) by a wire (301). The pattern (298) is connected to the pin (293) by a wire (333). Good points of this embodiment are;

(1) Since the package is a rectangular box, the package can be facilely mounted on a printed circuit.

(2) A driving circuit of the laser and an amplifier of the PDs can be stored in the same package.

(3) The use of the printed circuit enables the embodiment to minimize the size of the module including signal processors.

[EMBODIMENT 13: 1.3 μm module separating 1.55 μm PD]

Figure 27:
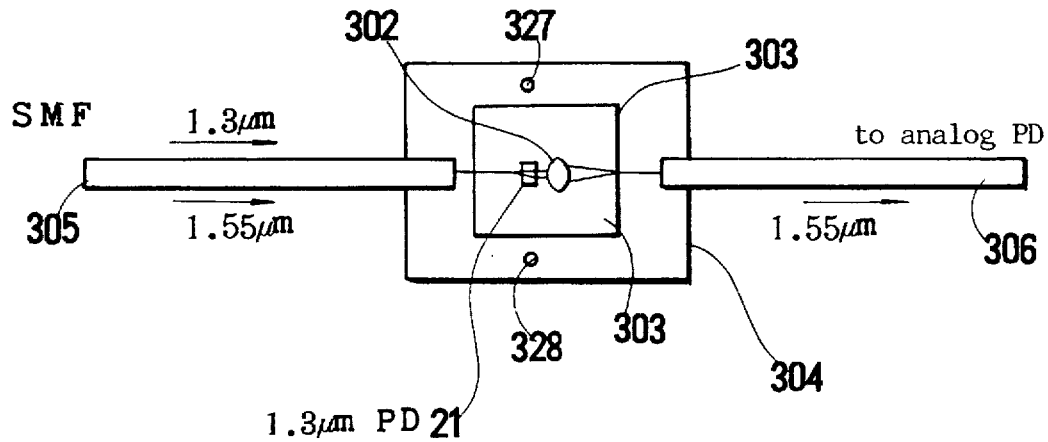
FIG. 27 is a sectional view of a PD module of a thirteenth embodiment.

FIG. 27 shows another embodiment which excludes the 1.55 μm PD from the module and stores the 1.55 μm PD in an external apparatus. A 1.3 μm photodiode (21) and a lens (302) are fixed on a submount (303). The submount (303) is sealed via a substrate in a package (304) which has lead pins (327) and (328). The package (304) holds two facing ends of single-mode fibers (305) and (306) disposed on the same line. The input SMF (305) leading to the central station carries both 1.3 μm signals and 1.55 μm signals. The light progresses through the 1.3 μm PD (21) and the lens (302) in the package (304). All the 1.3 μm light is absorbed by the PD (21). 1.55 μm light is converged by the lens (302) to the end of the fiber (306) which leads to the 1.55 μm PD. Embodiment 13 is suitable for such a system which arranges the analog circuit and the digital circuit on separate boards.

[EMBODIMENT 14: Dual line fiber PD/LD module]

Figure 28:
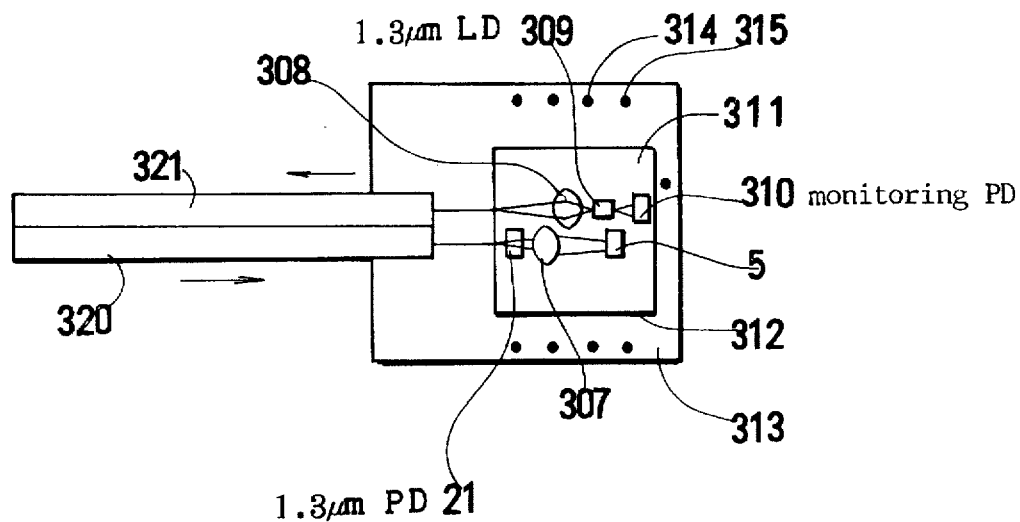
FIG. 28 is a sectional view of a PD/LD module having a built-in 1.55 μm PD of a fourteenth embodiment.

FIG. 28 denotes a PD/LD module using a dual line optical fiber(320/321). A 1.3 μm photodiode (21), a lens (307) and a 1.55 μm photodiode (5) are aligned in series on a submount (311) bonded on a substrate (312). A lens (308), a 1.3 μm LD (309) and a monitoring PD (310) are aligned on a direct line parallel with the first train of the PDs on the submount (311). Namely, the submount (311) holds two trains of optical devices in parallel. The submount (311) is protected in a package (313). The package (313) has lead pins (314) and (315). An end of a dual-line optical fiber (320/321) is inserted into the package (313). Propagating in the downstream fiber (320) from the broadcasting station, the 1.3/1.55 μm light shoots the 1.3 μm PD (21), the lens (307) and the final PD (5) of 1.55 μm in turn. The 1.3 μm LD (309) converts digital electric signals into optical signals which advances via the lens (308) into an end of the upward fiber (321).

[EMBODIMENT 15: Dual line fiber PD module separating 1.55 μm PD]

Figure 29:
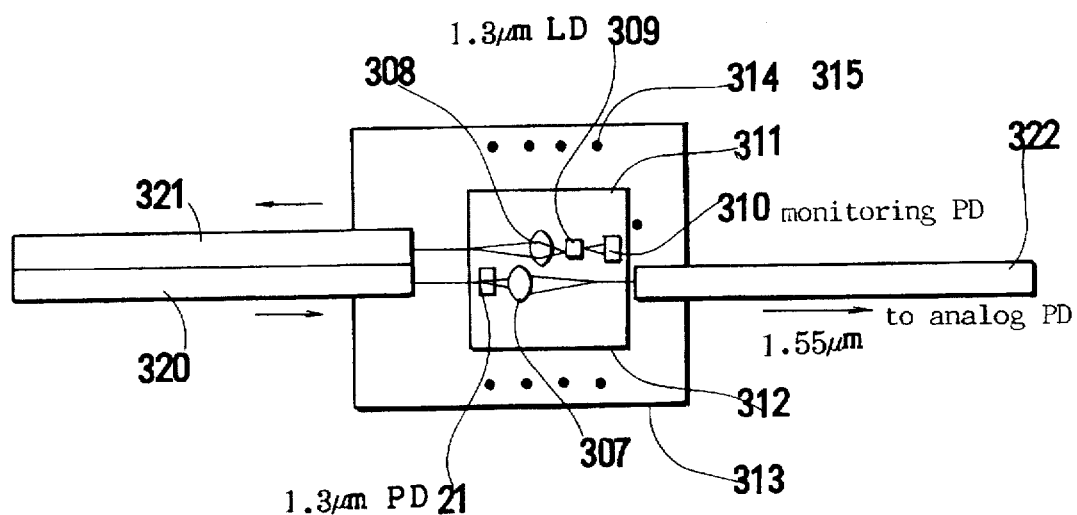
FIG. 29 is a sectional view of a PD/LD module having a fiber for guiding light to an external 1.55 μm PD as an fourteenth embodiment.

FIG. 29 shows a slightly changed version of FIG. 28. This example uses a dual-line fiber like embodiment 14. The 1.3 μm PD (21) and lens (307) are aligned on the submount (311). The downward light coming out of the fiber (320) advances through the 1.3 μm PD (21) and the lens (307). The 1.3 μm light is detected and absorbed by the PD (21). The second, 1.55 μm PD is transferred from the package (313) to some external apparatus. A fiber (322) connects the 1.3 μm-PD (21) in the package (313) with the separated 1.55 μm PD. The lens (307) converges the beams from the 1.3 μm PD (21) to an end of the fiber (322).

What we claim is:

1. A PD/LD module for bidirectional optical communication transmitting light signals of two different wavelengths $\lambda_1$ and $\lambda_2$ ($\lambda_1 < \lambda_2$) through an optical fiber between a broadcasting station and a plurality of ONU terminals, the PD/LD module comprising;

an optical coupler which divides a path leading to the optical fiber into a first path and a second path;

a laser diode aligned on the first path for converting electric signals into optical signals of the shorter wavelength $\lambda_1$;

a first photodiode including a bottom electrode having an opening therein and a light receiving layer having a characteristic energy gap $Eg_2$ that is larger than the energy $hc/\lambda_2$ of light having $\lambda_2$ wavelength but smaller than the energy $hc/\lambda_1$ of light having $\lambda_1$ wavelength ($hc/\lambda_2 < Eg_2 < hc/\lambda_1$, where the h is the Plank constant and c is speed of light), the first photodiode being aligned on the second path for detecting and absorbing the shorter wavelength $\lambda_1$ light and for allowing the longer wavelength $\lambda_2$ light to pass without absorption loss and pass through the bottom opening and;

a second photodiode aligned in series with the first photodiode on the second path for detecting the longer wavelength $\lambda_2$.

2. A PD/LD module as claimed in claim 1, wherein the optical coupler is a planar waveguide type coupler having a substrate, a cladding layer depositing on the substrate and bisecting core paths formed in the cladding layer by doping an impurity, the paths having a refractive index higher than that of the cladding.

3. A PD/LD module as claimed in claim 2, wherein the planar waveguide type coupler is a wavelength selective coupler allotting whole the longer wavelength $\lambda_2$ light to one of the paths and dividing the shorter wavelength $\lambda_1$ light into two bisecting paths by evanescent coupling at a definite ratio.

4. A PD/LD module as claimed in claim 3, wherein the planar wavelength selective coupler is a symmetric directional coupler having a bisection which is built by two core paths with equivalent sections having a contiguous part enabling two paths to exchange power at an arbitrary rate.

5. A PD/LD module as claimed in claim 3, wherein the planar wavelength selective coupler is an asymmetric directional coupler having a bisection which is built by two core paths with different sections having a contiguous part enabling two paths to exchange power at an rate in a definite scope.

6. A PD/LD module as claimed in claim 3, wherein the planar wavelength selective coupler is a Mach-Zehnder type directional coupler having a bisection which is built by two core paths having two contiguous parts enabling two paths to exchange power at an arbitrary rate.

7. A PD/LD module as claimed in claim 1, wherein $\lambda_1$=1.3 μm and $\lambda_2$=1.55 μm.

8. A PD/LD module as claimed in claim 7, wherein the first photodiode chip has an n-InP substrate, an n-InP buffer layer, an n-$In_{0.66}Ga_{0.34}As_{0.76}P_{0.24}$ ($\lambda g_2$=1.42 μm) light receiving layer, an $In_{0.82}Ga_{0.18}As_{0.40}P_{0.60}$($\lambda g_1$=1.15 μm) or an InP ($\lambda g_1$=0.92 μm) window layer and n- and p-electrodes which are formed on peripheries of the chip for allowing light to pass through the electrodes.

9. A PD/LD module as claimed in claim 8, wherein both surfaces of the chip through which light beams pass are coated with antireflection films.

10. A PD/LD module as claimed in claim 7, wherein the first photodiode chip has a light receiving layer made of $In_{0.66}Ga_{0.34}As_{0.76}P_{0.24}$ of $\lambda g_2$=1.42 μm.

11. A PD/LD module as claimed in claim 1, wherein the optical coupler is a mirror-type coupler having a glass substrate and a dielectric multilayer deposited on the glass substrate.

12. A PD/LD module as claimed in claim 11, wherein the mirror-type coupler is a wavelength selective coupler allowing whole the longer wavelength $\lambda_2$ light to pass through without reflection and dividing the shorter wavelength $\lambda_1$ light into two beams by reflection at a definite ratio.

13. A PD/LD module as claimed in claim 1, wherein the optical coupler is a fiber type coupler having two optical fibers which exchange energy with each other by an evanescent coupling between contiguous parts of the cores.

14. A PD/LD module as claimed in claim 13, wherein the fiber type coupler allotting whole the longer wavelength $\lambda_2$ light to one of the fibers and dividing the shorter wavelength $\lambda_1$ light into two fibers at a definite ratio by evanescent coupling.

15. A PD/LD module as claimed in claim 1, wherein the module comprises a header having lead pins with a central line, cap with a lens fixed on the header, a ferrule keeping an end of a fiber communicating with the second path and a ferrule holder fitted on the header for holding the ferrule, the first photodiode is fixed at a higher position on the central line of the header, the second photodiode is fixed at a lower position on the central line of the header, the cap seals the first photodiode and the second photodiode with the header and the lens converges the light from the fiber.

16. A PD/LD module for bidirectional optical communication transmitting light signals of a shorter wavelength $\lambda_1$ and a longer wavelength $\lambda_2$ ($\lambda_1 < \lambda_2$) through an optical fiber between a broadcasting station and a plurality of ONU terminals, the PD/LD module comprising;

an optical coupler which divides a path leading to the optical fiber into a first path and a second path;

a laser diode aligned on the first path for converting electric signals into optical signals of the shorter wavelength $\lambda_1$;

a first photodiode including a bottom electrode having an opening therein and a light receiving layer having a characteristic energy gap $Eg_2$ that is larger than the energy $hc/\lambda_2$ of light having $\lambda_2$ wavelength but smaller than the energy $hc/\lambda_1$ of light having $\lambda_1$ wavelength ($hc/\lambda_2 < Eg_2 < hc/\lambda_1$, where the h is the Plank constant and c is the speed of light), the first photodiode being aligned on the second path for detecting and absorbing the shorter wavelength $\lambda_1$ light and for allowing the longer wavelength $\lambda_2$ light to pass without absorption loss and pass through the bottom opening and;

an optical fiber aligned in series with the first photodiode on a path for guiding the light from the first photodiode to a second photodiode which is provided in an external apparatus.

17. A PD/LD module as claimed in claim 16, wherein the optical coupler is a planar waveguide type coupler having a substrate, a cladding layer depositing on the substrate and bisecting core paths formed in the cladding layer by doping an impurity, the paths having a refractive index higher than that of the cladding.

18. A PD/LD module as claimed in claim 17, wherein the planar waveguide type coupler is a wavelength selective coupler allotting whole the longer wavelength $\lambda_2$ light to one of the paths and dividing the shorter wavelength $\lambda_1$ light into two bisecting paths by evanescent coupling at a definite ratio.

19. A PD/LD module as claimed in claim 18, wherein the planar wavelength selective coupler is a symmetric directional coupler having a bisection which is built by two core paths with equivalent sections having a contiguous part enabling two paths to exchange power at an arbitrary rate.

20. A PD/LD module as claimed in claim 18, wherein the planar wavelength selective coupler is an asymmetric directional coupler having a bisection which is built by two core paths with different sections having a contiguous part enabling two paths to exchange power at an rate in a definite scope.

21. A PD/LD module as claimed in claim 18, wherein the planar wavelength selective coupler is a Mach-Zehnder type directional coupler having a bisection which is built by two core paths having two contiguous parts enabling two paths to exchange power at an arbitrary rate.

22. A PD/LD module as claimed in claim 16, wherein $\lambda_1$=1.3 μm and $\lambda_2$=1.55 μm.

23. A PD/LD module as claimed in claim 22, wherein the first photodiode chip has an n-InP substrate, an n-InP buffer layer, an n-In$_{0.66}$Ga$_{0.34}$As$_{0.76}$P$_{0.24}$ ($\lambda$g$_2$=1.42 μm) light receiving layer, an In$_{0.82}$Ga$_{0.18}$As$_{0.40}$P$_{0.60}$($\lambda$g$_1$=1.15 μm) or an InP ($\lambda$g$_1$=0.92 μm) window layer and n- and p-electrodes which are formed on peripheries of the chip for allowing light to pass through the electrodes.

24. A PD/LD module as claimed in claim 23, wherein both surfaces of the chip through which light beams pass are coated with antireflection films.

25. A PD/LD module as claimed in claim 22, wherein the first photodiode chip has a light receiving layer made of In$_{0.66}$Ga$_{0.34}$As$_{0.76}$P$_{0.24}$ of $\lambda$g$_2$=1.42 μm.

26. A PD/LD module as claimed in claim 16, wherein the optical coupler is a mirror-type coupler having a glass substrate and a dielectric multilayer deposited on the glass substrate.

27. A PD/LD module as claimed in claim 26, wherein the mirror-type coupler is a wavelength selective coupler allowing whole the longer wavelength $\lambda_2$ light to pass through without reflection and dividing the shorter wavelength $\lambda_1$ light into two beams by reflection at a definite ratio.

28. A PD/LD module as claimed in claim 16, wherein the optical coupler is a fiber type coupler having two optical fibers which exchange energy with each other by an evanescent coupling between contiguous parts of the cores.

29. A PD/LD module as claimed in claim 28, wherein the fiber type coupler allotting whole the longer wavelength $\lambda_2$ light to one of the fibers and dividing the shorter wavelength $\lambda_1$ light into two fibers at a definite ratio by evanescent coupling.

30. A PD/LD module for bidirectional optical communication transmitting light signals of two different wavelengths $\lambda_1$ and $\lambda_2$ ($\lambda_1$<$\lambda_2$) through an upward optical fiber and a downward optical fiber between a broadcasting station and a plurality of ONU terminals, the PD/LD module comprising;

A laser diode coupled to the upward optical fiber for converting electric signals into optical signals of the shorter wavelength $\lambda_1$;

a first photodiode including a bottom electrode having an opening therein and a light receiving layer having a characteristic energy gap Eg$_2$ that is larger than the energy hc/$\lambda_2$ of light having $\lambda_2$ wavelength but smaller than the energy hc/$\lambda_1$ of light having $\lambda_1$ wavelength (hc/$\lambda_2$<hc$\lambda_2$, where h is the Plank constant and c is speed of light), the first photodiode being coupled to the downward optical fiber for detecting and absorbing the shorter wavelength $\lambda_1$ light and for allowing the longer wavelength $\lambda_2$ light to pass without absorption loss and pass through the bottom opening and;

a second photodiode aligned in series with the first photodiode for detecting the longer wavelength $\lambda_2$.

31. A PD/LD module as claimed in claim 30, wherein $\lambda_1$=1.3 μm and $\lambda$2=1.55 μm.

32. A PD/LD module as claimed in claim 31, wherein the first photodiode chip has an n-InP substrate, an n-InP buffer layer, an n-In$_{0.66}$Ga$_{0.34}$As$_{0.76}$P$_{0.24}$ ($\lambda$g$_2$=1.42 μm) light receiving layer, an In$_{0.82}$ G$_{a0.18}$As$_{0.40}$P$_{0.60}$($\lambda$g$_1$=1.15 μm) or an InP ($\lambda$g$_1$=0.92 μm) window layer and n- and p-electrodes which are formed on peripheries of the chip for allowing light to pass through the electrodes.

33. A PD/LD module as claimed in claim 32, wherein both surfaces of the chip through which light beams pass are coated with antireflection films.

34. A PD/LD module as claimed in claim 31, wherein the first photodiode chip has a light receiving layer made of In$_{0.66}$Ga$_{0.34}$As$_{0.76}$P$_{0.24}$ of $\lambda$g$_2$=1.42 μm.

35. A PD/LD module as claimed in claim 30, wherein the module comprises a header having lead pins with a central line, a cap with -a lens fixed on the header, a ferrule keeping an end of a downward fiber and a ferrule holder fitted on the header for holding the ferrule, the first photodiode is fixed-at a higher position on the central line of the header, the second photodiode is fixed at a lower position on the central line of the header, the cap seals the first photodiode and the second photodiode with the header and the lens converges the light from the fiber.

36. A PD/LD module as claimed in claim 30, wherein each one of a dual line optical fiber gives the downward fiber and the upward fiber.

37. A PD/LD module for bidirectional optical communication transmitting light signals of two different wavelengths $\lambda_1$ and $\lambda_2$ ($\lambda_1$<$\lambda_2$) in an upward optical fiber and a downward optical fiber between a broadcasting station and a plurality of ONU terminals comprising;

a laser diode being coupled to the upward optical fiber for converting electric signals into optical signals of the shorter wavelength $\lambda_1$;

a first photodiode having an opening of a bottom electrode and a light receiving layer with an energy gap Eg$_2$ being bigger than the energy hc/$\lambda_2$ of the light $\lambda_2$but smaller than the energy hc/$\lambda_1$ of the light $\lambda_1$(hc/$\lambda_2$<Eg$_2$<hc/$\lambda_1$), the first photodiode being coupled to the downward optical fiber for detecting and absorbing all the shorter wavelength $\lambda_1$ light and for allowing the longer wavelength $\lambda_2$ light to pass without absorption loss and go out of the bottom opening and;

an optical fiber aligning in series with the first photodiode on a path for guiding the light from the first photodiode to a second photodiode which is provided in some external apparatus.

38. A PD/LD module as claimed in claim 37, wherein $\lambda_1$=1.3 μm and $\lambda_2$=1.55 μm.

39. A PD/LD module as claimed in claim 38, wherein the first photodiode chip has an n-InP substrate, an n-InP buffer layer, an n-In$_{0.66}$Ga$_{0.34}$As$_{0.76}$P$_{0.24}$ ($\lambda$g$_2$=1.42 μm) light receiving layer, an In$_{0.82}$Ga$_{0.18}$As$_{0.40}$P$_{0.60}$($\lambda$g$_1$=1.15 μm) or an InP ($\lambda$g$_1$=0.92 μm) window layer and n- and p-electrodes which are formed on peripheries of the chip for allowing light to pass through the electrodes.

40. A PD/LD module as claimed in claim 39, wherein both surfaces of the chip through which light beams pass are coated with antireflection films.

41. A PD/LD module as claimed in claim 38, wherein the first photodiode chip has a light receiving layer made of In$_{0.66}$Ga$_{0.34}$As$_{0.76}$P$_{0.24}$ of $\lambda$g$_2$=1.42 μm.

42. A PD/LD module as claimed in claim 37, wherein each one of a dual line optical fiber gives the downward fiber and the upward fiber.

43. A PD module for unidirectional optical communication transmitting light signals of two different wavelengths $\lambda_1$ and $\lambda_2$ ($\lambda_1$<$\lambda_2$) through an optical fiber from a broadcasting station to a plurality of ONU terminals, the PD module comprising:

a first photodiode including:
a bottom electrode having an opening therein and
a light receiving layer having a characteristic energy gap Eg$_2$ that is larger than the energy hc/$\lambda_2$ of light having $\lambda_2$ wavelength but smaller than the energy hc/$\lambda_1$ of light having $\lambda_1$ wavelength (hc/$\lambda_2$<Eg$_2$<hc/$\lambda_1$, where h is the Plank constant and c is the speed of light), the first photodiode being coupled to the optical fiber for detecting and absorbing the shorter wavelength $\lambda_1$ light and for allowing the longer wavelength $\lambda_2$ light to pass without absorption loss and pass through the bottom opening; and a second photodiode aligned in series with the first photodiode for detecting the longer wavelength $\lambda_2$.

44. A PD module as claimed in claim 43, wherein $\lambda_1=1.3$ μm and $\lambda_2=1.55$ μm.

45. A PD module as claimed in claim 44, wherein the first photodiode chip has a light receiving layer made of $In_{0.66}Ga_{0.34}As_{0.76}P_{0.24}$ of $\lambda g_2=1.42$ μm.

46. A PD module as claimed in claim 45, wherein the first photodiode chip has an n-InP substrate, an n-InP buffer layer, an n-$In_{0.66}Ga_{0.34}As_{0.76}P_{0.24}$ ($\lambda g_2=1.42$ μm) light receiving layer, an $In_{0.82}Ga_{0.18}As_{0.40}P_{0.60}$($\lambda g_1=1.15$ μm) or an InP ($\lambda g_1=0.92$ μm) window layer and n- and p-electrodes which are formed on peripheries of the chip for allowing light to pass through the electrodes.

47. A PD module as claimed in claim 46, wherein both surfaces of the chip through which light beams pass are coated with antireflection films.

48. A PD module as claimed in claim 43, wherein the module comprises a header having lead pins with a central line, a cap with a lens fixed on the header, a ferrule keeping an end of a downward fiber and a ferrule holder fitted on the header for holding the ferrule, the first photodiode is fixed at a higher position on the central line of the header, the second photodiode is fixed at a lower position on the central line of the header, the cap seals the first photodiode and the second photodiode with the header and the lens converges the light from the fiber.

49. A PD module for unidirectional optical communication transmitting light signals of two different wavelengths $\lambda_1$ and $\lambda_2$ ($\lambda_1<\lambda_2$) through an optical fiber from a broadcasting station to a plurality of ONU terminals, the PD module comprising:

a first photodiode having:
 a bottom electrode having an opening therein and
 a light receiving layer having a characteristic energy gap $Eg_2$ that is larger than the energy $hc/\lambda_2$ of the light having $\lambda_2$ wavelength but smaller than the energy $hc/\lambda_1$ of light having $\lambda_1$ wavelength ($hc/\lambda_2<Eg_2<hc/\lambda_1$, where h is the Plank constant and c is the speed of light), the first photodiode being coupled to the optical fiber for detecting and absorbing the shorter wavelength $\lambda_1$ light and for allowing the longer wavelength $\lambda_2$ light to pass without absorption loss and pass through the bottom opening; and an optical fiber aligned in series with the first photodiode on a path for guiding the light from the first photodiode to a second photodiode which is provided in an external apparatus.

50. A PD module as claimed in claim 49, wherein $\lambda_1=1.3$ μm and $\lambda_2=1.55$ μm.

51. A PD module as claimed in claim 50, wherein the first photodiode chip has an n-InP substrate, an n-InP buffer layer, an n-$In_{0.66}Ga_{0.34}As_{0.76}P_{0.24}$ ($\lambda g_2=1.42$ μm) light receiving layer, an $In_{0.82}Ga_{0.18}As_{0.40}P_{0.60}$($\lambda g_1=1.15$ μm) or an InP ($\lambda g_1=0.92$ μm) window layer and n- and p-electrodes which are formed on peripheries of the chip for allowing light to pass through the electrodes.

52. A PD module as claimed in claim 51, wherein both surfaces of the chip through which light beams pass are coated with antireflection films.

53. A PD module as claimed in claim 50, wherein the first photodiode chip has a light receiving layer made of $In_{0.66}Ga_{0.34}As_{0.76}P_{0.24}$ of $\lambda g_2=1.42$ μm.

54. A PD module as claimed in claim 49, wherein the module comprises a header having lead pins with a central line, a cap with a lens fixed on the header, a ferrule keeping an end of a downward fiber and a ferrule holder fitted on the header for holding the ferrule, the first photodiode is fixed at a higher position on the central line of the header, the second photodiode is fixed at a lower position on the central line of the header, the cap seals the first photodiode and the second photodiode with the header and the lens converges the light from the fiber.

* * * * *

UNITED STATES PATENT AND TRADEMARK OFFICE
CERTIFICATE OF CORRECTION

PATENT NO. : 5,764,826
DATED : June 9, 1998
INVENTOR(S) : Kuhara, et al

It is certified that error appears in the above-identified patent and that said Letters Patent is hereby corrected as shown below:

On the title page;

Please change "[22] Filed Jul. 29, 1998" to --[22] Filed Jul. 26, 1996--.

Signed and Sealed this

Sixth Day of June, 2000

Attest:

Q. TODD DICKINSON

*Attesting Officer*  *Director of Patents and Trademarks*